US006999015B2

(12) United States Patent
Zhang et al.

(10) Patent No.: US 6,999,015 B2

(45) Date of Patent: Feb. 14, 2006

(54) ELECTRONIC DEVICE, A DIGITAL-TO-ANALOG CONVERTER, AND A METHOD OF USING THE ELECTRONIC DEVICE

(75) Inventors: Weixiao Zhang, Goleta, CA (US); Zhining Chen, Goleta, CA (US); Gang Yu, Santa Barbara, CA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/860,354

(22) Filed: Jun. 3, 2004

(65) Prior Publication Data

US 2005/0270204 A1 Dec. 8, 2005

(51) Int. Cl.
*H03M 3/00* (2006.01)

(52) U.S. Cl. ........................ 341/144; 341/143; 345/98; 345/100

(58) Field of Classification Search .................. 345/82, 345/87, 89, 95, 97, 98, 100, 204; 341/143–144
See application file for complete search history.

(56) References Cited

U.S. PATENT DOCUMENTS

| | | | | |
|---|---|---|---|---|
| 5,343,215 | A | 8/1994 | Tanaka | |
| 5,523,772 | A * | 6/1996 | Lee | 345/98 |
| 5,604,511 | A * | 2/1997 | Ohi | 345/98 |
| 5,708,452 | A * | 1/1998 | Takahashi | 345/82 |
| 5,719,589 | A | 2/1998 | Norman et al. | |
| 5,748,160 | A | 5/1998 | Shieh et al. | |
| 5,751,263 | A | 5/1998 | Huang et al. | |
| 5,856,816 | A * | 1/1999 | Youn | 345/98 |
| 6,020,869 | A | 2/2000 | Sasaki et al. | |
| 6,104,364 | A * | 8/2000 | Hayashi | 345/87 |
| 6,169,532 | B1 * | 1/2001 | Sumi et al. | 345/98 |
| 6,317,107 | B1 | 11/2001 | Ninoyu et al. | |
| 6,317,138 | B1 | 11/2001 | Yano et al. | |
| 6,373,419 | B1 * | 4/2002 | Nakao | 341/154 |
| 6,429,841 | B1 | 8/2002 | Lee | |
| 6,459,416 | B1 | 10/2002 | Sasaki et al. | |
| 6,462,723 | B1 | 10/2002 | Yamazaki et al. | |
| 6,483,496 | B1 | 11/2002 | Kobayashi et al. | |
| 6,509,885 | B1 | 1/2003 | Hanaki et al. | |
| 6,518,977 | B1 | 2/2003 | Naka et al. | |
| 6,522,314 | B1 | 2/2003 | Tomio et al. | |
| 6,549,156 | B1 * | 4/2003 | Moser | 341/144 |
| 6,603,466 | B1 * | 8/2003 | Sakaguchi et al. | 345/204 |
| 6,617,796 | B1 * | 9/2003 | Sasaki et al. | 315/169.1 |
| 6,747,626 | B1 * | 6/2004 | Chiang | 345/98 |
| 6,778,119 | B1 * | 8/2004 | May | 341/144 |
| 6,809,670 | B1 * | 10/2004 | Sun | 341/136 |

(Continued)

*Primary Examiner*—Peguy JeanPierre
*Assistant Examiner*—Khai M. Nguyen

(57) ABSTRACT

In one embodiment, a D/A converter includes a D/A module and a first differential amplifier. The D/A module converts a digital signal to a first analog signal. The first differential amplifier amplifies the first analog signal from the D/A module to a second analog signal. In another embodiment, an electronic device includes D/A converters and sample-and-hold circuits coupled the D/A converters. The D/A converters may or may not include the D/A modules and differential amplifiers. In still another embodiment, an electronic device includes a first electronic component and a first control signal regulator coupled to the first electronic component. A method of using the electronic device includes determining a first maximum setting for the control signal regulator in order to achieve a first radiation intensity from the first electronic component during a first time period and determining a second maximum setting during a second time period.

21 Claims, 10 Drawing Sheets

U.S. PATENT DOCUMENTS

| | | | |
|---|---|---|---|
| 2001/0033252 | A1 * | 10/2001 | Yamazaki et al. ............ 345/7 |
| 2002/0033783 | A1 | 3/2002 | Koyama |
| 2002/0167471 | A1 | 11/2002 | Everitt |
| 2003/0001806 | A1 | 1/2003 | Bae et al. |
| 2003/0071804 | A1 | 4/2003 | Yamazaki et al. |
| 2003/0151616 | A1 | 8/2003 | Morita |
| 2003/0151617 | A1 | 8/2003 | Morita |
| 2003/0197666 | A1 | 10/2003 | Akimoto et al. |
| 2003/0197667 | A1 | 10/2003 | Numao |
| 2003/0201955 | A1 | 10/2003 | Song et al. |
| 2003/0210256 | A1 | 11/2003 | Mori et al. |
| 2003/0234800 | A1 | 12/2003 | Nakajima et al. |
| 2004/0001076 | A1 | 1/2004 | Leng et al. |
| 2004/0036705 | A1 | 2/2004 | Jung et al. |
| 2004/0046771 | A1 | 3/2004 | Liao et al. |

* cited by examiner

ELECTRONIC DEVICE, A DIGITAL-TO-ANALOG CONVERTER, AND A METHOD OF USING THE ELECTRONIC DEVICE

BACKGROUND OF THE INVENTION

1. Field of the Invention

This invention relates in general to electronic devices, and more particularly, to electronic devices comprising digital-to-analog ("D/A") converters and methods of using those electronic devices.

2. Description of the Related Art

Organic electronic devices have attracted considerable attention since the early 1990's. Examples of organic electronic devices include Organic Light-Emitting Diodes ("OLEDs"), which include Polymer Light-Emitting Diodes ("PLEDs") and Small Molecule Organic Light-Emitting Diodes ("SMOLEDs"). Display devices, including OLED displays, have played an important role in modern human life. As computing, telecommunications, home entertainment, and networking technologies converge, the display unit will become more important.

In the display area, there are many kinds of technologies including cathode ray tube ("CRT"), liquid crystal display ("LCD"), and so on. LCD technology is dominant in the present flat panel display market. However, as display size increases, this technology has some issues with the backlight and power consumption. OLED technologies have great potential advantages over other display technologies, especially in larger size displays.

OLED material lifetime is a concern, however. Organic active layers, when used in radiation-emitting electronic components, have a finite lifetime. After a long time of driving a stationary image, inhomogeneity and decay of emission intensity can occur due to different driving (stress) conditions at the organic electronic level.

A compensation mechanism can be used to extend the lifetime of an OLED display as the OLED material degrades. One compensation scheme can use peripheral driving electronics within the peripheral circuitry. Row drivers and data drivers, as parts of the peripheral electronics, are used to turn on the display. FIG. 1 includes a block diagram of conventional data driver 100. R, G, and B data, from external digital video inputs for Red, Green and Blue electronic components, are received by data control unit 102 and are routed to the data latch unit 122. An address shift register 104 receives an external enable signal, a shift direction signal, and a shift clock signal. The external enable signal is used to enable the address shift register 104. The shift direction signal controls the shift direction (from scan line 1 to scan line n or from scan line n to scan line 1). The shift clock signal provides a reference timing signal from which activities in the conventional data driver 100 can be coordinated. The data latch unit 122 also receives a latch enable signal and a load signal. The data latch unit 122 may or may not include storage registers. If storage registers are present, data can be transferred from individual data latches to their corresponding storage registers. The latch enable signal is used to enable individual data latches (or storage registers, if present) within the data latch unit 122, and the load signal enables the captured datum for each data latch to be output to D/A converter 124. The D/A converter 124 also receives a gray scale reference signal, which controls the D/A converter relationship and obtains suitable gamma correction for the display. Outputs from the D/A converter 124 are received by output-signal drivers 126, which can send data along data lines to electronic components within an array of a display.

A brief of overview of the operation of the data driver 100 is given below. The address shift register 104 produces scan signals from scan line 1 to scan line n (or scan line n to scan line 1) as determined by the shift direction signal. The data latch unit captures the input R, G and B data pixel by pixel, controlled by the scan signal from address shift register 104, until a whole row of data are recorded into data latch unit 122. The recorded row data is output from data latch unit 122 and received by D/A converter 124 when a load signal is received by the data latch unit 122. The D/A converter 124 changes the digital signals received from the data latch unit 122 into analog signals and outputs them to the output-signal drivers 126, which in turn sends analog signals to the display. Conventionally, the D/A converter 124 has a fixed $V_{max}$ (maximum analog output voltage) and a fixed $V_{min}$ (minimum analog output voltage). $V_{max}$ and $V_{min}$ do not change.

SUMMARY OF THE INVENTION

In one embodiment, a D/A converter includes a D/A module and a first differential amplifier. The D/A module converts a digital signal to a first analog signal. A first input of the D/A module is configured to receive the digital signal, and a first output of the D/A module is configured to output the first analog signal. The first differential amplifier amplifies the first analog signal to a second analog signal. The first differential amplifier includes a first input coupled to the first output from the D/A module, a second input coupled to a first control signal, and an output configured to output the second analog signal.

In another embodiment, an electronic device includes D/A converters and sample-and-hold circuits coupled the D/A converters. The electronic device also includes at least one organic electronic component coupled to the sample-and-hold circuits. The at least one organic electronic component includes at least one organic active layer.

In still another embodiment, an electronic device includes a first electronic component and a first control signal regulator coupled to the first electronic component. A method of using the electronic device includes determining a first maximum setting for the control signal regulator in order to achieve a first radiation intensity from the first electronic component during a first time period. The method also includes determining a second maximum setting for the first control signal regulator in order to achieve the first radiation intensity from the first electronic component during a second time period.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
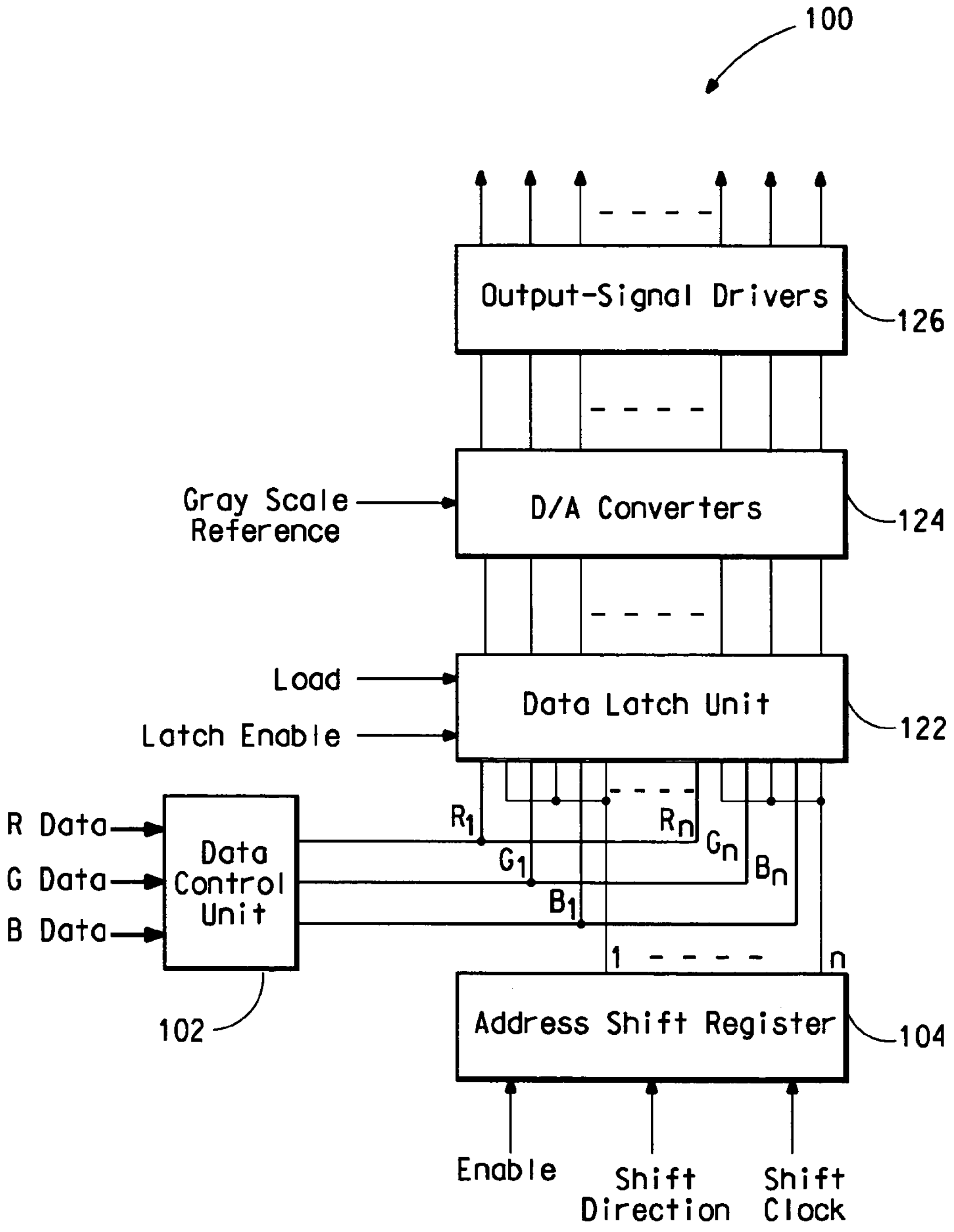
FIG. 1 (PRIOR ART)
FIG. 1 includes a block diagram of a conventional data driver. (Prior art).

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In one embodiment, a D/A converter includes a D/A module and a first differential amplifier. The D/A module converts a digital signal to a first analog signal. A first input of the D/A module is configured to receive the digital signal, and a first output of the D/A module is configured to output the first analog signal. The first differential amplifier amplifies the first analog signal to a second analog signal. The first differential amplifier includes a first input coupled to the first output from the D/A module, a second input coupled to a first control signal, and an output configured to output the second analog signal.

In another embodiment, the D/A module comprises a second input configured to receive $V_{ref}$. The first control signal is $V_{min}$.

In still another embodiment, the D/A converter further includes a first resistive electronic component and a second resistive electronic component. The first resistive electronic component has a first terminal and a second terminal, wherein the first terminal of the first resistive electronic component is connected to the D/A module, and the second terminal of the first resistive electronic component is connected to the first input of the first differential amplifier. The second resistive electronic component has a first terminal and a second terminal, wherein the first terminal of the second resistive electronic component is connected to the first input of the first differential amplifier, and the second terminal of the second resistive electronic component is connected to the output of the first differential amplifier. The first resistive electronic component and the second resistive electronic component have substantially the same resistance.

In one embodiment, the D/A module further includes a voltage divider network and a second differential amplifier. The voltage divider network includes a second input for receiving a second control signal, switches configured to receive the digital signal from the first input, and resistive electronic components coupled to the second input. The second differential amplifier includes a first input coupled to an output of the voltage divider network, a second input connected to an AGND line, and an output coupled to the first input of the first differential amplifier.

In one specific embodiment, the resistive electronic components of the voltage divider include first resistive electronic components and second resistive electronic components. Each of the first resistive electronic components has substantially a first resistance, and each of the second resistive electronic components has substantially a second resistance that is substantially twice the first resistance.

In another specific embodiment, each of the first and second differential amplifiers further includes a third input configured to receive $AV_{dd}$ and a fourth input configured to receive $AV_{ss}$.

In yet another embodiment, an organic electronic device includes any of the D/A converters described above and an organic electronic component configured to receive data from the D/A converter. The organic electronic component includes an organic active layer.

In one embodiment, an electronic device includes D/A converters and sample-and-hold circuits coupled the D/A converters. The electronic device also includes at least one organic electronic component coupled to the sample-and-hold circuits. The at least one organic electronic component includes at least one organic active layer.

In another embodiment, each of the sample-and-hold circuits includes a first switch, a first capacitive electronic component, and a first buffer. The first switch includes an input, an output, and a control. The input of the first switch is connected to one of the D/A converters, and the control of the first switch is coupled to a scan line. The first capacitive electronic component includes a first electrode and a second electrode. The first electrode of the first capacitive electronic component is connected to an AGND line, and the second electrode of the first capacitive electronic component is connected to the output of the first switch. The first buffer includes a first input and an output. The first input of the first buffer is connected to the output of the first switch and the second electrode of the first capacitive electronic component.

Each of the sample-and-hold circuits can further include a second switch, a second capacitive electronic component, and a second buffer. The second switch includes an input, an output, and a control. The input of the second switch is connected to the output of the first buffer, and the control of the second switch is coupled to an output enable line. The second capacitive electronic component includes a first electrode and a second electrode. The first electrode of the second capacitive electronic component is connected to an AGND line, and the second electrode of the second capacitive electronic component is connected to the output of the second switch. The second buffer includes a first input and an output. The first input of the second buffer is connected to the output of the second switch and the second electrode of the second capacitive electronic component, and the output of the second buffer is connected to one of the output-signal drivers.

In yet another embodiment, the first buffer comprises a first differential amplifier, and the second buffer comprises a second differential amplifier. First power inputs for the first and second differential amplifiers are configured to receive $AV_{dd}$, and second power inputs for the first and second differential amplifiers are configured to receive $AV_{ss}$. Positive inputs for the first and second differential amplifiers are the first inputs of the first and second buffers, respectively, and negative inputs for the first and second differential amplifiers are connected to the outputs of the first and second buffers, respectively. Inputs for the D/A converters can include $AV_{dd}$, $AV_{ss}$, AGND, $V_{ref}$ and $V_{min}$.

In a further embodiment, an electronic device further includes an array of pixels organized into rows and columns, wherein each row or each column comprises at least one of the D/A converters, at least one of the sample-and-hold circuits, and at least one of the output-signal drivers. In another embodiment, each pixel comprises at least three organic electronic components, wherein along a row or column, each row or each column includes at least three of the D/A converters, at least three of the sample-and-hold circuits, and at least three of the output-signal drivers.

In yet a further embodiment, the electronic device further includes output-signal drivers. The output-signal drivers are coupled to and, from a circuit diagram perspective, lie between the sample-and-hold circuits and the organic electronic components.

In one embodiment, an electronic device includes a first electronic component and a first control signal regulator coupled to the first electronic component. A method of using the electronic device includes determining a first maximum setting for the first control signal regulator in order to achieve a first radiation intensity from the first electronic component during a first time period. The method also includes determining a second maximum setting for the first control signal regulator in order to achieve the first radiation intensity from the first electronic component during a second time period.

In another embodiment, the method further includes using the first electronic component at a third time between the first and second times. In still another embodiment, the method further includes determining a first minimum setting of the first control signal regulator. The first minimum setting is proportional to the first maximum setting divided by a number of designed levels of the first radiation intensity. The method can still further include determining a second minimum setting of the first control signal regulator. The second minimum setting is proportional to the second maximum setting divided by a number of designed levels of the first radiation intensity.

In a further embodiment, the first control signal regulator includes a transistor that controls a current flowing to or from the first electronic component. In a specific embodiment, each of the first minimum setting and the second minimum setting is equal to a threshold voltage of the transistor.

In one specific embodiment, the electronic device comprises a data driver circuit designed to operate using at least n bits of data.

$$V_{min} \approx (V_{max1} - V_{th})/2^{n/2} + V_{th}$$

wherein:

$V_{min1}$ is the first minimum setting;

$V_{th}$ is a threshold voltage for the transistor;

$V_{max1}$ is the first maximum setting; and n is the number of bits within a digital input signal.

In still another specific embodiment, the electronic device includes a D/A converter, which includes a voltage divider network. The voltage divider network includes first resistive electronic components and second resistive electronic components, wherein each of the first resistive electronic components has substantially a first resistance, and each of the second resistive electronic components has substantially a second resistance that is substantially twice the first resistance. The D/A converter also includes a differential amplifier coupled to an output of the voltage divider network. The D/A converter further includes a third resistive electronic component having a first terminal connected to an output of the differential amplifier, and a second terminal connected to an input of the differential amplifier.

In one specific embodiment, $$V_{ref} \approx (V_{max1} - 2V_{th})*2^n*R/(R_f*(2^n-1)) + AGND,$$

wherein:

$V_{ref}$ is a control voltage;

R is the first resistance;

$R_f$ is a resistance of the third resistive electronic component; and

AGND is a voltage of analog ground.

In another embodiment, the electronic device further includes a second electronic component and a second control signal regulator coupled to the second electronic component. The electronic device also includes a third electronic component and a third control signal regulator coupled to the third electronic component. The method further includes determining a first maximum setting for the second control signal regulator in order to achieve a second radiation intensity from the second electronic component during the first time period, and determining a first maximum setting for the third control signal regulator in order to achieve a third radiation intensity from the third electronic component during the first time period. The method yet further includes determining a second maximum setting for the second control signal regulator in order to achieve the second radiation intensity from the second electronic component during the second time period, and determining a second maximum setting for the third control signal regulator in order to achieve the third radiation intensity from the third electronic component during the second time period.

In one specific embodiment, $$\Delta V_{max1} = (V_{max12} - V_{max11})/V_{n\text{-}max1};$$

$$\Delta V_{max2} = (V_{max22} - V_{max21})/V_{n\text{-}max2};$$

$$\Delta V_{max3} = (V_{max32} - V_{max31})/V_{n\text{-}max3};$$

$\Delta V_{max1}$ is a relative change between the first and second maximum settings for the first control signal regulator;

$V_{max12}$ is the second maximum setting for the first control signal regulator;

$V_{max11}$ is the first maximum setting for the first control signal regulator;

$V_{n\text{-}max1}$ is a normalization factor for the first control signal regulator, which can be the first maximum setting for the first control signal regulator, the second maximum setting for the first control signal regulator, or an averaged value using the first and second maximum settings for the first control signal regulator;

$\Delta V_{max2}$ is a relative change between the first and second maximum settings for the second control signal regulator;

$V_{max22}$ is the second maximum setting for the second control signal regulator;

$V_{max21}$ is the first maximum setting for the second control signal regulator;

$V_{n\text{-}max2}$ is a normalization factor for the second control signal regulator, which can be the first maximum setting for the second control signal regulator, the second maximum setting for the second control signal regulator, or an averaged value using the first and second maximum settings for the second control signal regulator;

$\Delta V_{max3}$ is a relative change between the first and second maximum settings for the third control signal regulator;

$V_{max32}$ is the second maximum setting for the third control signal regulator;

$V_{max31}$ is the first maximum setting for the third control signal regulator; and $V_{n\text{-}max3}$ is a normalization factor for the third control signal regulator, which can be the first maximum setting for the third control signal regulator, the second maximum setting for the third control signal regulator, or an averaged value using the first and second maximum settings for the third control signal regulator;

at least one of $\Delta V_{max1}$, $\Delta V_{max2}$, or $\Delta V_{max3}$ has a value different from at least one of the other two.

In another embodiment, the first electronic component includes an organic active layer.

Before addressing details of embodiments described below, some terms are defined or clarified. As used herein, the term "active" when referring to a layer or material is intended to mean a layer or material that has electronic or electro-radiative properties. An active layer material may emit radiation or exhibit a change in concentration of electron-hole pairs when receiving radiation.

The term "AGND" is intended to mean an analog ground voltage, which is substantially 0 volts.

The terms "array," "peripheral circuitry," and "remote circuitry" are intended to mean different areas or components of an electronic device. For example, an array may include a number of pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "$AV_{dd}$," and "$AV_{ss}$" are intended to mean a relatively positive analog power supply voltage and a relatively negative analog power supply voltage, respectively, for an analog circuit within an electronic device. The actual voltage of $AV_{dd}$ and $AV_{ss}$ may be positive, negative, zero, or any combination thereof. The voltage differential between $AV_{dd}$ and $AV_{ss}$ is typically more important than the actual values of $AV_{dd}$ and $AV_{ss}$, as electronic components may operate based on the voltage difference.

The term "averaged," when referring to a value, is intended to mean an intermediate value between a high value and a low value. For example, an averaged value can be an average, a geometric mean, or a median.

The term "buffer" is intended to mean a circuit to provide compatibility between two signals. For example, the buffer can change voltage levels, current capability, or can provide electrical isolation between the signals (e.g., reduce noise).

The term "capacitive electronic component" is intended to mean an electronic component configured to act as a capacitor when illustrated in a circuit diagram. Examples of capacitive electronic components include capacitor and transistor structures.

The term "circuit" is intended to mean a collection of electronic components that collectively, when properly connected and supplied with the appropriate potential(s), performs a function. A thin film transistor ("TFT") driver circuit for an organic electronic component is an example of a circuit.

The term "connected," with respect to electronic components or portions thereof, is intended to mean that two or more electronic components or portions do not have any intervening electronic component lying between them. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "control signal" is intended to mean a signal that that controls an output signal. Examples of control signals include $V_{ref}$ and $V_{min}$.

The term "control signal regulator" is intended to mean one or more electronic components used to regulate the amount of current flowing through a circuit or the amount of voltage applied to at least a portion of a circuit. A transistor is an example of a control signal regulator that can be used as a current regulator. For a field-effect transistor, the current flowing between a source and drain of the field-effect transistor can be adjusted by raising or lowering the potential on the gate (changing the saturation current level of the field-effect transistor).

The term "coupled" is intended to mean a connection, linking, or association of two or more electronic components, circuits, or systems in such a way that a signal (e.g., current, voltage, or optical signals) may be transferred from one to another. Non-limiting examples of "coupled" can include direct connections between electronic components, circuits or electronic components with switch(es) (e.g., transistor(s)) connected between them, or the like.

The term "D/A converter" is intended to mean one or more circuits that can convert a digital signal into an analog signal.

The term "D/A module" is intended to mean one or more circuits that can convert a digital signal into an analog signal, wherein the analog signal from the D/A module may need to be further processed (e.g., amplified) before using it in another portion of an electronic device.

The term "differential amplifier" is intended to mean one or more circuits that amplify or deamplify the difference between input signals to produce an output signal.

The term "$\Delta V_{max}$" is intended to mean a change in $V_{max}$ for a radiation-emitting component between two different times or time periods.

The term "electrode" is intended to mean a structure configured to transport carriers. For example, an electrode may be an anode, a cathode, a capacitor electrode, a gate electrode, etc. Electrodes may include parts of transistors, capacitors, resistors, inductors, diodes, organic electronic components and power supplies.

The term "electronic component" is intended to mean a lowest level unit of a circuit that performs an electrical function. An electronic component may include a transistor, a diode, a resistor, a capacitor, an inductor, or the like. An electrical component does not include parasitic resistance (e.g., resistance of a wire) or parasitic capacitance (e.g., capacitive coupling between two conductors connected to different electronic components where a capacitor between the conductors is unintended or incidental).

The term "electronic device" is intended to mean a collection of circuits, electronic components, or combinations thereof that collectively, when properly connected and supplied with the appropriate potential(s), performs a function. An electronic device may include or be part of a system. Examples of electronic devices include displays, sensor arrays, computer systems, avionics, automobiles, cellular phones, and many other consumer and industrial electronic products.

The term "number of designed levels," when referring to radiation intensity, is intended to mean the number of different levels of radiation intensity that an electronic component is designed to emit or to which the electronic component is to respond.

The term "organic electronic device" is intended to mean a device including one or more organic semiconductor layers or materials. Organic electronic devices include: (1) devices that convert electrical energy into radiation (e.g., a light-emitting diode, light-emitting diode display, diode laser, or lighting panel), (2) devices that detect signals through electronics processes (e.g., photodetectors (e.g., photoconductive cells, photoresistors, photoswitches, phototransistors, phototubes), infrared ("IR") detectors, biosensors), (3) devices that convert radiation into electrical energy (e.g., a photovoltaic device or solar cell), and (4) devices that include one or more electronic components that include one or more organic semiconductor layers (e.g., a transistor or diode).

The term "output-signal driver" is intended to mean one or more circuits used to send signals to electronic components within an array.

The term "radiation intensity" is intended to mean the strength of a radiation flux, and may be given in units of $cd/m^2$.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultra violet ("UV") or IR). A light-emitting diode is an example of a radiation-emitting component.

The term "radiation-responsive component" is intended to mean an electronic component, which when properly biased, can sense or respond to radiation at a targeted wavelength or spectrum of wavelengths. The radiation may be within the visible-light spectrum or outside the visible-light spectrum (UV or IR). IR sensors, biosensors, and photovoltaic cells are examples of radiation-responsive components.

The term "resistive electronic component" is intended to mean an electronic component configured to act as a resistor when illustrated in a circuit diagram. Examples of resistive electronic components include resistor and transistor structures.

The term "sample-and-hold circuit" is intended to mean electronic components designed to temporarily store a signal before the signal is allowed to be transmitted to another part of an electronic device.

The term "setting" is intended to mean a control value for an electronic component or a circuit. When a field-effect transistor is used as a control signal regulator, the setting can be the gate voltage for the field-effect transistor.

The term "signal" is intended to mean a current, a voltage, an optical signal, or any combination thereof. The signal can be a voltage or current from a power supply or can represent, by itself or in combination with other signal(s), data or other information. Optical signals can be based on pulses, intensity, or a combination thereof. Signals may be substantially constant (e.g., power supply voltages) or may vary over time (e.g., one voltage for on and another voltage for off).

The term "switch" is intended to mean one or more electronic components configured to act as a switch when illustrated in a circuit diagram. Examples of switches include diode and transistor structures.

The term "$V_{max}$" is intended to mean a maximum voltage used to control a control signal regulator to achieve a maximum designed emission intensity.

The term "$V_{min}$" is intended to mean a minimum voltage used to control a control signal regulator at its lowest designed setting. As the number of designed levels of emission intensity increase, $V_{min}$ approaches $V_{th}$, when a field-effect transistor is used for a control signal regulator.

The term "$V_{ref}$" is intended to mean a reference voltage for establishing $V_{max}$.

The term "$V_{th}$" is intended to mean a threshold voltage for a field-effect transistor.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Group numbers corresponding to columns within the periodic table of the elements use the "New Notation" convention as seen in the CRC Handbook of Chemistry and Physics, 81st Edition (2000).

To the extent not described herein, many details regarding specific materials, processing acts, and circuits are conventional and may be found in textbooks and other sources within the organic light-emitting display, photodetector, semiconductor and microelectronic circuit arts.

Figure 2:
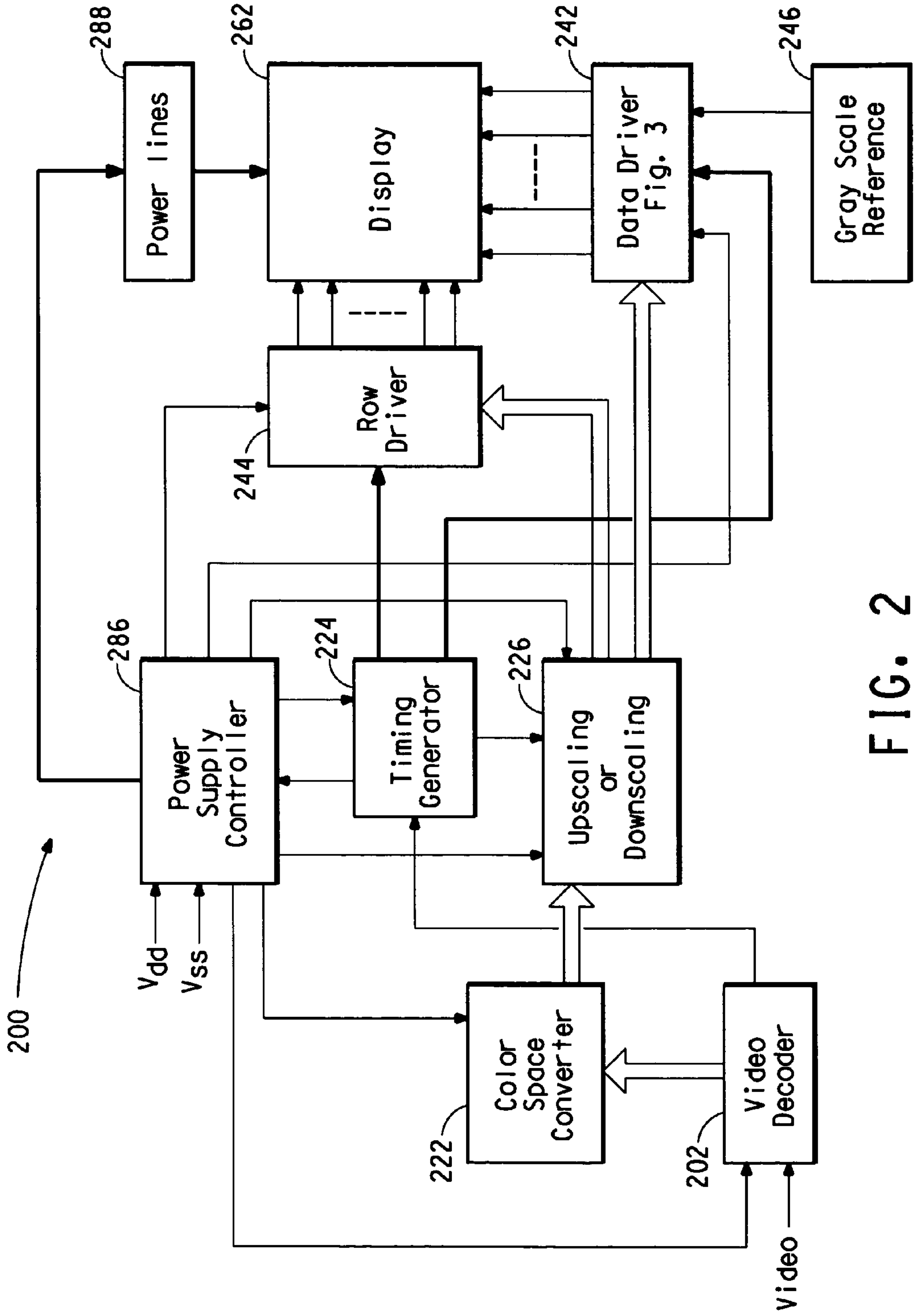
FIG. 2 includes a block diagram of a display system in accordance with one embodiment.

Illustrative, non-limiting hardware embodiments of a display system are described before addressing operations of the hardware. FIG. 2 includes a system diagram for a display system 200 in accordance with one embodiment. A video decoder 202 is used to decode external video signals (National Television System Committee ("NTSC"), Phase Alternating Line ("PAL"), Sequential Colour Avec Memoire ("SECAM") or S-video, etc.). Color space converter 222 changes the external video color format (such as YUV, YCbCr, or other format into RGB format). Upscaling or downscaling unit 226 is used to scale an input format into a suitable display format. The timing generator 224 produces timing signals for the different parts of the display system 200. Power supply controller 286 receives $V_{ss}$ and $V_{dd}$ voltages and provides power for other parts of the display system 200, including power lines 288 that are coupled to the display 262. Row driver unit 244 and data driver unit 242 produce output signals (current or voltage) to turn the display 262 on or off. Gray scale reference unit 246 sets gamma correction reference levels and allows the data driver 242 to perform gamma correction for the display 262. Arrows within FIG. 2 illustrate the routing and principal directions of signals. However, in other embodiments, additional routing, the reverse flow of signals, or bidirectional flows of signals can be used. Other than data driver 242, all other parts of the display system shown in FIG. 2 can be conventional in one embodiment.

Figure 3:
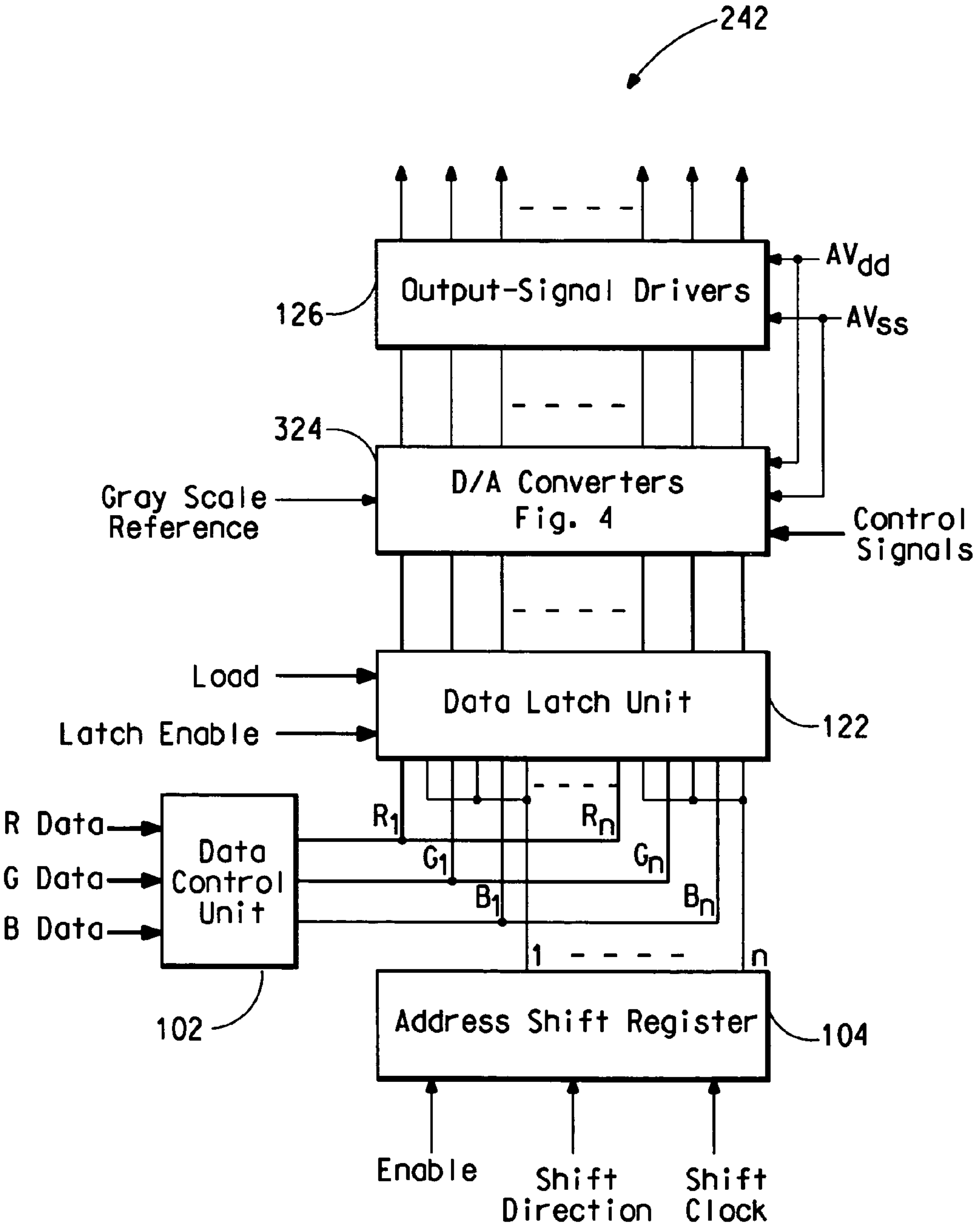
FIG. 3 includes a block diagram of a data driver including inputs for control signals and analog power supply signals in accordance with one embodiment.

FIG. 3 includes a block diagram of data driver 242 in accordance with one embodiment. Compare FIG. 1 to FIG. 3. Within one embodiment of data driver 242, each of the data control unit 102, address shift register 104, data latch unit 122, and output-signal drivers 126 are conventional. Unlike FIG. 1, D/A converter 324 is different from D/A converter 124. Also, control signals are received by D/A converter 324 and $AV_{dd}$ and $AV_{ss}$ signals are received by the D/A converter 324 and the output-signal driver 126.

The control signals include $V_{ref}$ and $V_{min}$. In one embodiment, the display is monochromatic; each pixel within the display has only one radiation-emitting electronic component. In this embodiment, only one $V_{ref}$ and $V_{min}$ are used by the D/A converter. In another embodiment, the display is a full color display, and each pixel within the display has a red radiation-emitting electronic component, a green radiation-emitting electronic component, and a blue radiation-emitting electronic component. In this embodiment, three sets (one set for each color) of $V_{ref}$ and $V_{min}$ are used by the D/A converter. In still another embodiment, two sets or more than three sets of $V_{ref}$ and $V_{min}$ may be used.

Typically, digital circuits operate using $V_{dd}$ and $V_{ss}$ to set the voltage differential for operating circuits. Between $V_{dd}$ and $V_{ss}$, $V_{dd}$ is at a higher voltage than $V_{ss}$. The voltage difference between $V_{dd}$ and $V_{ss}$ may be approximately, 5 volts, 3.3 volts, 1.8 volts, or the like. In one embodiment, the voltage difference between $V_{dd}$ and $V_{ss}$ is 3.3 volts. In one embodiment, the D/A converter 124 may operate using another voltage difference between $V_{dd}$ and $V_{ss}$. $AV_{dd}$ and $AV_{ss}$ may be generated by an internal step-up or step-down power converter circuit in the data driver 242 or by an external source. In one embodiment, the voltage difference between $AV_{dd}$ and $AV_{ss}$ may be 10 volts. Between $AV_{dd}$ and $AV_{ss}$, $AV_{dd}$ is at a higher voltage than $AV_{ss}$. In other embodiments, other voltage differences between $AV_{dd}$ and A $V_{ss}$ may be used. The actual voltage of each of $V_{dd}$, $V_{ss}$, $AV_{dd}$, and $AV_{ss}$ as compared to a ground potential (0 volts) may be positive, negative, or zero.

Figure 4:
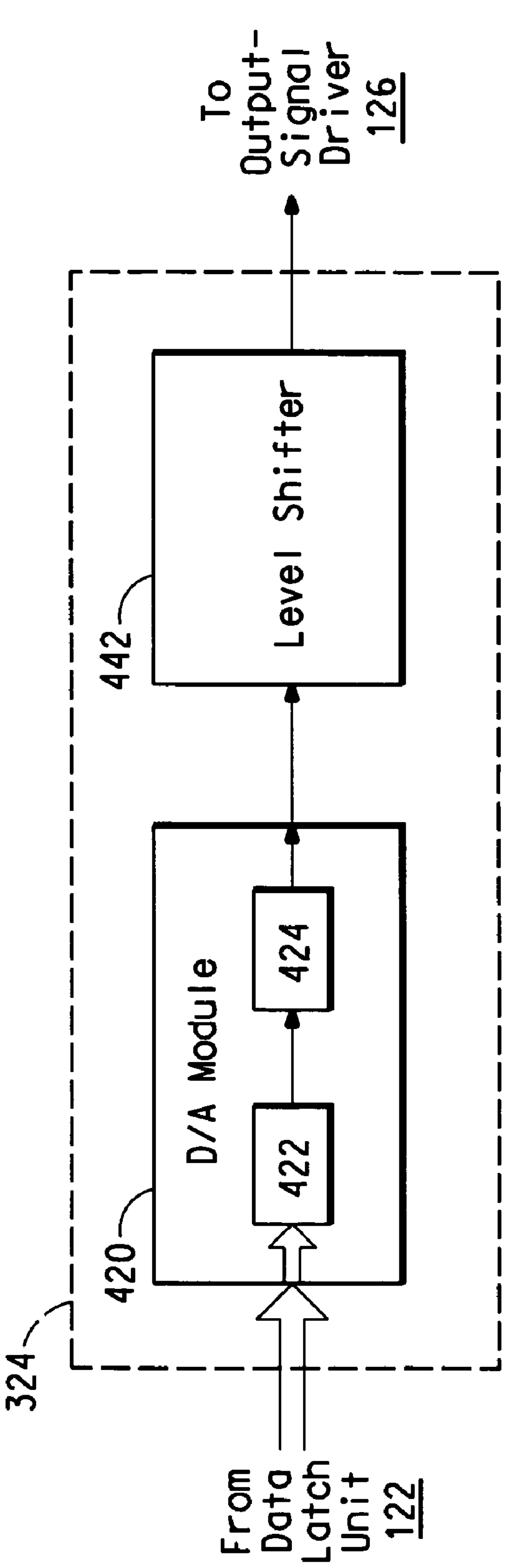
FIG. 4 includes a block diagram of a D/A converter in accordance with one embodiment.

FIG. 4 includes a simplified block diagram of D/A converter 324, which comprises a D/A module 420 and a signal level shifter 442. In one embodiment, the D/A module 420 comprises a voltage divider network 422 and an I-V converter 424. Details of the voltage divider network 422 and the I-V converter 424 are described with respect to FIG. 5. A digital signal from data latch unit 122 is received by the voltage divider network 422 and is converted to a first analog signal that is received by the I-V converter 424. The I-V converter 424 converts the first analog signal to a second analog signal. In one embodiment, a current may be input into the I-V converter 424, and a voltage is output by the I-V converter 424. The second analog signal is received by the signal level shifter 442, which amplifies the second analog signal to a third analog signal that is sent to the output-signal driver 126. The $V_{ref}$ and $V_{min}$ signals are not illustrated in FIG. 4 to simplify understanding of the D/A converter 324 and its operation.

Figure 5:
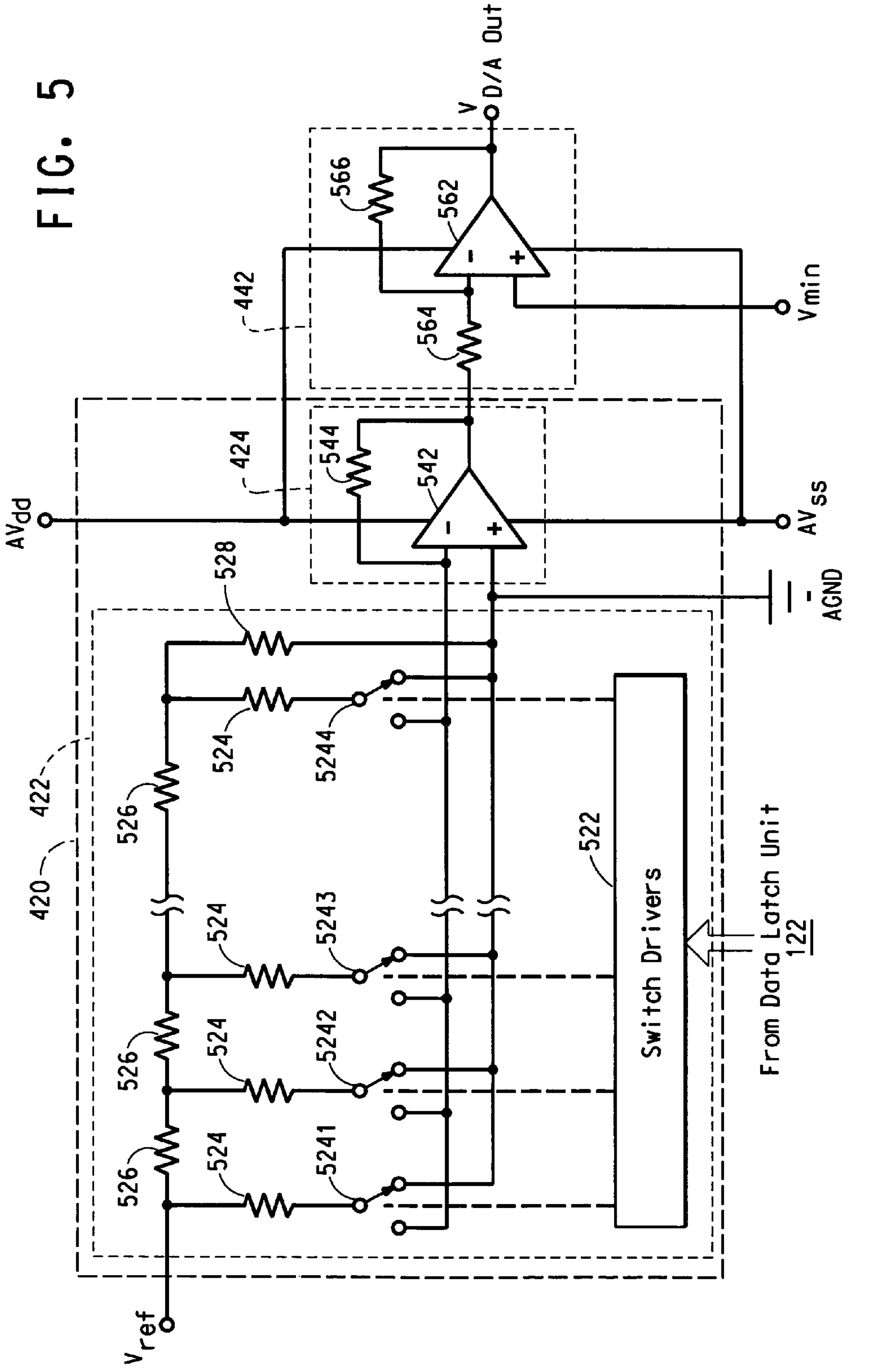
FIG. 5 includes a circuit diagram of one embodiment of the D/A converter in accordance with the block diagram of FIG. 4.

FIG. 5 includes a circuit schematic drawing of D/A converter 324 in accordance with one embodiment. Dashed lines illustrate the D/A module 420, voltage divider network 422, I-V converter 424, and signal level shifter 442 as described in FIG. 4. FIG. 5 includes the control signals ($V_{ref}$ and $V_{min}$), and power supply lines configured to receive power supply signals ($AV_{dd}$, $AV_{ss}$, and analog ground ("AGND").

In one embodiment, the voltage divider network 422 includes switch drivers 522 and a network of R-2R ladders. In another embodiment, the switch drivers 522 are separate from the voltage divider network 422 and other control signals may be provided to the R-2R ladders. The switch drivers 522 receive the digital output signal from the data latch unit 122. In one embodiment, the digital output signal is transmitted along an n-bit wide bus. The value of n is a whole number. As n increases, the number of different emission intensity levels, as seen at the display, increases. In general, the number of designed levels of intensity can be $2^n$. For example, 8 bits allows for up to 256 different levels of intensity. In other embodiments, more or fewer bits may be used.

The switch drivers 522 separate the data on a bit-by-bit basis and use that information to provide control signals to switches 5241–5244. Each bit position in the n-bit wide data bus has a corresponding switch, and therefore, the number of switches depends on the width of the data bus. Switch 5241 corresponds to the most significant position of the digital data, switch 5242 corresponds to the next most significant position of the digital data, and so on, until switch 5244, which corresponds to the least significant position of the digital data. Other switches are present but not illustrated to simplify understanding. For each of the switches 5241–5244, the input is connected to resistive electronic components 524, a first output is connected to an AGND line and a first (positive) input of the I-V converter 424, and a second output is connected to a second (negative) input of the I-V converter 424.

Each of the switch drivers 522 and switches 5241–5244 includes one or more electronic components. In one embodiment, the switch drivers 522 and switches 5241–5244 include transistors. The transistors can include bipolar transistors (npn, pnp, or any combination thereof) or field-effect transistors (junction field-effect transistors (JFETs), metal-insulator-semiconductor field-effect transistors (MISFETs), including metal-oxide-semiconductor field-effect transistors (MOSFETs), metal-nitride-oxide-semiconductor (MNOS) field-effect transistors, TFTs, or any combination thereof), or any combination of bipolar and field-effect transistors. Field-effect transistors can be n-channel (n-type carriers flowing within the channel region), p-channel (p-type carriers flowing within the channel region), or a combination thereof (i.e., complementary MOS ("CMOS")). Field-effect transistors may be enhancement-mode transistors (channel region having a different conductivity type compared to the source/drain regions) or depletion-mode transistors (channel and source/drain regions have the same conductivity type), or any combination thereof.

Resistive electronic components 526 are connected to one another in series and each terminal of the resistive electronic components 526 are connected to the resistive electronic components 524 as illustrated in FIG. 5. A $V_{ref}$ line is connected to (1) the resistive electronic component 524 that is connected to the switch 5241 and (2) the resistive electronic component 526 that, from a circuit diagram, lies between the resistive electronic components 524, which in turn are connected to switches 5241 and 5242. A resistive electronic component 528 is connected to (1) the resistive electronic component 524 that is connected to switch 5244 and (2) the second input to the I-V converter 424.

The resistance of each of the resistive electronic components 524 and 528 is approximately twice the resistance of each of the resistive electronic components 526. The resistances of the resistive electronic components 524 may be the same or different when compared to one another. Also, the resistances of the resistive electronic components 526 may also be the same or different when compared to one another. The actual resistances are not critical. In one embodiment, any or all of the resistances of resistive electronic components 524, 526, or 528 are in a range of approximately 1 Kohm to 1 Mohm.

The I-V converter 424 comprises a differential amplifier 542 and a resistive electronic component 544. The first input to the differential amplifier 542 is connected to the AGND line and the first output of the voltage divider network 422. The second input of the differential amplifier 542 is connected to the second output of the voltage divider network 422. Third and fourth inputs of the differential amplifier 542 are connected to $AV_{dd}$ and $\Delta V_{ss}$ power supply lines, respectively. A first terminal of the resistive electronic component 544 is connected to an output of the differential amplifier 542, and a second terminal of the resistive electronic component 544 is connected to the second input to the differential amplifier 542.

In one embodiment, the differential amplifier 542 is part of an operational amplifier. In another embodiment, the differential amplifier 542 and resistive electronic component 544 are part of the same operational amplifier. In still another embodiment, differential amplifier 542 is not part of an operational amplifier. The actual resistance of resistive electronic component 544 is not critical. In one embodiment, the resistance of resistive electronic component 544 is in a range of approximately 1 Kohm to 1 Mohm.

The I-V converter 424 is coupled to the signal level shifter 442. In one embodiment, the signal level shifter 442 comprises a differential amplifier 562 and resistive electronic components 564 and 566. In other embodiments, any or all of resistive electronic components 564 and 566 are not part of the signal level shifter 442.

The first terminal of the resistive electronic component 564 is connected to the output of the I-V converter 424, and the second terminal of the resistive electronic component 564 is connected to the first (negative) input of the differential amplifier 562. The first terminal of the resistive electronic component 566 is connected to the first input of the differential amplifier 562, and a second terminal of the resistive electronic component 566 is connected to an output of the differential amplifier 562. A second (positive) input of the differential amplifier 562 is connected to a $V_{min}$ line. Third and fourth inputs of the differential amplifier 562 are connected to $AV_{dd}$ and $AV_{ss}$ power supply lines, respectively. In one embodiment, the output of the differential amplifier 562 is the output of the D/A converter 324 and is sent to the output-signal drivers 126.

In one embodiment, the differential amplifier 562 is part of an operational amplifier. In another embodiment, the differential amplifier 562 and any one or more of resistive electronic components 564 and 566 are part of the same operation amplifier. In still another embodiment, differential amplifier 562 is not part of an operational amplifier.

In one embodiment, the resistances of the resistive electronic components 564 and 566 are approximately the same. The actual resistances are not critical. In one embodiment, the resistances of resistive electronic components 564 and 566 are in a range of approximately 1 Kohm to 1 Mohm.

The output-signal drivers 126 provide data signals for operating the display 262. In one embodiment, the display 262 includes organic electronic components having one or more organic active layers. In one specific embodiment, the display 262 is a full-color active matrix ("AM") display. Each pixel within the display comprises a red radiation-emitting electronic component, a green radiation-emitting electronic component, and a blue radiation-emitting electronic component. The number of D/A converters 324 used for the display 262 is the number of columns times the number of radiation-emitting electronic components per pixel. For a full-color display having 480 rows×800 columns, 2400 D/A converters 324 (800 columns times 3 components/pixel) would be used. In another embodiment, the display is oriented so that column drivers, instead of row drivers are used. With the same sized display, 1440 D/A converters 324 (480 rows times 3 components/pixel) would be used.

Figure 6:
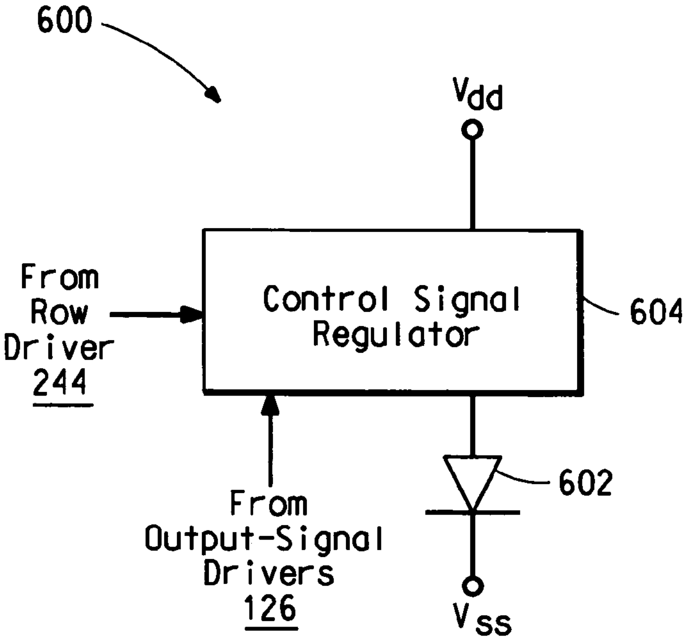
FIGS. 6 and 7 include block diagrams of control signal regulators used for regulating the emission intensity of radiation-emitting electronic components.
Figure 7:
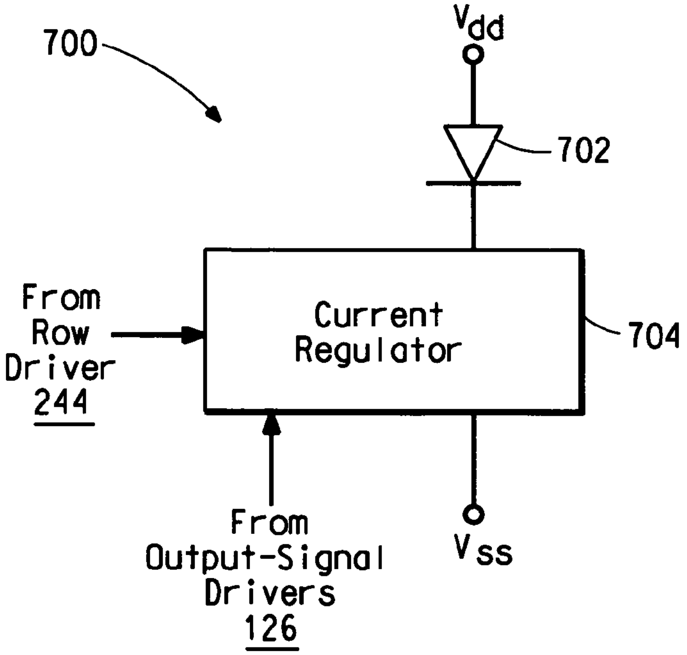

In FIGS. 6 and 7, display driver circuits 600 and 700 are illustrated and include radiation-emitting electronic components 602 and 702 and control signal regulators 604 and 704. In one embodiment, the radiation-emitting electronic components 602 and 702 are OLEDs, and the control signal regulators 604 and 704 are current regulators configured to regulate the current flowing through the radiation-emitting electronic components 602 and 702 when those electronic components are being driven. In another embodiment, the radiation-emitting electronic components 602 and 702 are inorganic LEDs and are voltage driven instead of current driven. In this other embodiment, the control signal regulators 604 and 704 can be voltage regulators. The remainder of the description regarding FIGS. 6 and 7 addresses the embodiment where the control signal regulators 604 and 704 are used as current regulators.

The control signal regulator 604 lies between a $V_{dd}$ line and the radiation-emitting electronic component 602, and the control signal regulator 704 lies between the radiation-emitting electronic component 702 and a $V_{ss}$ line. In one embodiment, a conventional pixel driver circuit used for AMOLED displays may be used for control signal regulator 604 or 704.

Each of the control signal regulators 604 and 704 may include a first transistor that acts as a power transistor and allows sufficient current to flow to the radiation-emitting electronic component 602 or 702. The first transistor may be any of the types of transistors described with respect to the switch drivers 522 or switches 5241–5244. One of the terminals (source, drain, collector, or emitter) of the transistor is connected to one of the power supply lines, another terminal (source, drain, collector, or emitter) of the transistor is connected to one of the terminals of the radiation-emitting electronic component 602 or 702, and the control (gate or base) of the transistor is coupled to a data line that is coupled to one of the output-signal drivers 126. The control signal regulator 604 or 704 may further include a second transistor, such as any of the types of transistors described with respect to the switch drivers 522 or switches 5241–5244. The second transistor acts as a select transistor to allow the data signal on the data line to pass to the control of the first transistor. In one embodiment, when a proper control signal is supplied to the control (e.g., gate or base) of the second transistor, the data signal passes to the control of the first transistor. The actual value and polarity of the control signal depends on the specific design of the second transistor and can be determined by a skilled artisan. In another embodiment, the second transistor may not be present and the control of the first electrode would be connected to the data line.

The operation of one embodiment in accordance with FIG. 6 is described. In this embodiment, an n-channel, enhancement mode MISFET is used as the first transistor within control signal regulator 604. The drain of the first transistor is connected to a $V_{dd}$ line, the source of the first transistor is connected to an anode of the radiation-emitting electronic component 602, a control of the first transistor is coupled to the data line via the second transistor, and the cathode of the radiation-emitting electronic component 602 is connected to the $V_{ss}$ line.

Figure 8A:
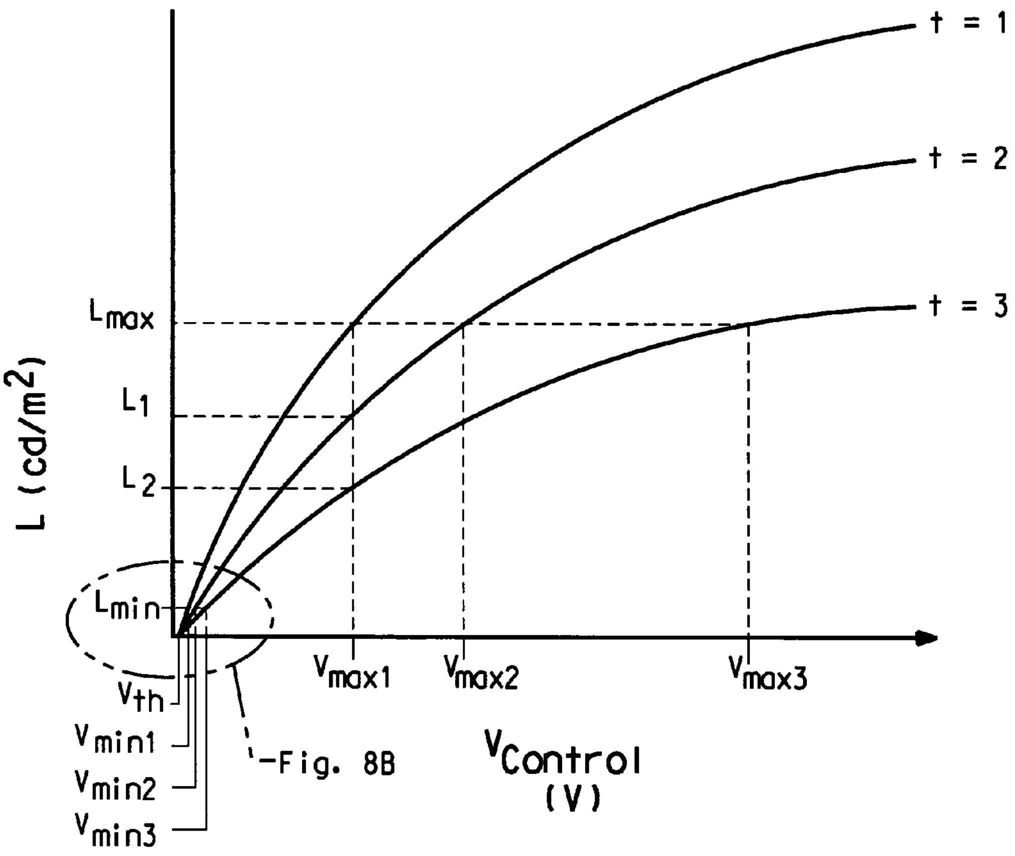
FIGS. 8A an 8B include plots of emission intensity as a function of control voltage during three different time periods.
Figure 8B:
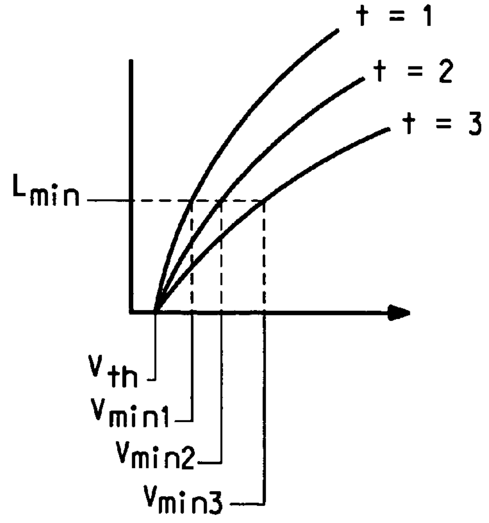

The voltage on the control of the first transistor affects the emission intensity of the radiation-emitting electronic component 602. Initially (at t=1), a plot of control voltage ($V_{control}$) versus emission intensity (L) is illustrated in FIGS. 8A and 8B. No significant radiation emission occurs until the threshold voltage ($V_{th}$) of the first transistor is reached.

The relationship between L and $V_{control}$ is given by Equation 1.

$$L=K*(V_{control}-V_{th})^2 \quad \text{Equation 1}$$

wherein:

K=u*W*$C_{ox}$/L wherein W and L are width and length of a channel of the thin film transistor (TFT), $C_{ox}$ is the capacitance of the gate dielectric, and u is the mobility of the channel material.

In one embodiment, the radiation-emitting electronic component 602 can include a material that degrades as the radiation-emitting electronic component 602 is used or ages. For example, the radiation-emitting electronic component 602 can include an organic electronic component that includes an organic active layer. In such an embodiment, radiation is emitted from the organic active layer. Referring to FIGS. 8A and 8B, three plots of L versus $V_{control}$ are illustrated. The t=1 line represents a first time, the t=2 line represents a time later than t=1, and the t=3 line represents a time later than t=2.

If a conventional data driving system is used, the maximum control voltage is initially set (e.g., at $V_{max1}$) and does not change. Referring to Equation 1, K and $V_{th}$ are effectively treated by the conventional data driving system as constants that never change. However, as can be seen in FIG. 8A, as the radiation-emitting electronic component 602 degrades, the maximum emission intensity decreases from $L_{max}$, which may be a designed or specified (predetermined) maximum emission intensity at t=1, to L1 at t=2, and then to L2 at t=3. Therefore, K and $V_{th}$ change as the radiation-emitting electronic component 602 is used or ages.

Unlike the conventional data driving system, the data driving system as described herein can change the allowable $V_{control}$ to change as one or more materials within the radiation-emitting electronic component 602 degrades. Referring to Equation 1, the data driving system as described herein compensates for the change(s) in K, $V_{th}$, or both as the radiation-emitting component is used or ages. In one embodiment, the change in K, $V_{th}$, or both is a reduction. In order to achieve substantially the same $L_{max}$ in FIG. 8A, the maximum voltage for $V_{control}$ is changed from $V_{max1}$ at t=1, to $V_{max2}$ at t=2, and to $V_{max3}$ at t=3.

Put in more generic terms, the method for using an electronic device including the radiation-emitting electronic component 602 can include determining a first maximum setting (e.g., $V_{max1}$) for the control signal regulator 604 in order to achieve a radiation intensity (e.g., $L_{max}$) from the radiation-emitting electronic component during a first time period (e.g., t=1). The determination may be performed using a radiation-responsive electronic component within or separate from the electronic device. $V_{control}$ is changed until $L_{max}$ is achieved. $V_{control}$ becomes $V_{max1}$ when $L_{max}$ is achieved. After the radiation-emitting electronic component 602 is used or ages, the maximum setting of the control signal regulator 604 may need to be adjusted. The method can further include determining a second maximum setting (e.g., $V_{max2}$) for the control signal regulator 604 in order to achieve the radiation intensity (e.g., $L_{max}$) from the radiation-emitting electronic component 602 during a second time period (e.g., t=2). The method can be repeated during a third time period to determine a third maximum setting ($V_{max3}$), and for other subsequent times, if desired.

In general, the minimum setting for the control signal regulator can be determined by Equation 2.

$$V_{min}=(V_{max}-V_{th})/2^{n/2}+V_{th} \quad \text{Equation 2}$$

wherein n is the width (expressed in a number of bits) of the data bus coming from the data latch unit 122.

If an 8-bit wide data bus is used, $$V_{min}=(V_{max}-V_{th})/2^{8/2}+V_{th}$$

$$=(V_{max}-V_{th})/16+V_{th}$$

As n gets very large, $V_{min}$ is approximately $V_{th}$, and in one embodiment, $V_{min}$ may be considered equal to $V_{th}$. At t=1, $V_{min1}$ is determined by substituting $V_{max1}$ for $V_{max}$ in Equation 2, at t=2, $V_{min2}$ is determined by substituting $V_{max2}$ for $V_{max}$ in Equation 2, and at t=3, $V_{min3}$ is determined by substituting $V_{max3}$ for $V_{max}$ in Equation 2.

Reference is now made to FIG. 5 in order to explain the workings of the D/A converter 324 as illustrated. The control signals for the D/A converter 324 include $V_{min}$ (described above) and $V_{ref}$. $V_{ref}$ is determined by Equation 3.

$$V_{ref}=(V_{max}-2V_{th})*2^n*R/[(2^n-1)*R_f]+AGND \quad \text{Equation 3}$$

wherein R is the resistance of one of the resistive electronic components 526, and Rf is the resistance of the resistive electronic component 544.

Similar to $V_{min}$, $V_{ref}$ changes with a change in $V_{max}$. Therefore, at t=1, $V_{ref1}$ is determined by substituting $V_{max1}$ for $V_{max}$ in Equation 3, at t=2, $V_{ref2}$ is determined by substituting $V_{max2}$ for $V_{max}$ in Equation 3, and at t=3, $V_{ref3}$ is determined by substituting $V_{max3}$ for $V_{max}$ in Equation 3.

Based on the value of the digital signal, the switch drivers 522 send control signals to the switches 5241–5244 to reflect the digital signal on a bit-by-bit basis. In one embodiment, an 8-bit wide data bus is used for the digital signal. Eight switches are used within the voltage-divider network.

$$I_7=(V_{ref}-AGND)/2R \quad \text{Equation 4}$$

$$I_6=(V_{ref}-AGND)/4R \quad \text{Equation 5}$$

$$I_5=(V_{ref}-AGND)/8R \quad \text{Equation 6}$$

$$I_4=(V_{ref}-AGND)/16R \quad \text{Equation 7}$$

$$I_3=(V_{ref}-AGND)/32R \quad \text{Equation 8}$$

$$I_2=(V_{ref}-AGND)/64R \quad \text{Equation 9}$$

$$I_1=(V_{ref}-AGND)/128R \quad \text{Equation 10}$$

$$I_0=(V_{ref}-AGND)/256R \quad \text{Equation 11}$$

The output voltage ($V_{out}$) is given in Equation 12.

$$V_{out}=(I_7*D_{bit7}+I_6*D_{bit6}+I_5*D_{bit5}+I_4*D_{bit4}+I_3*D_{Bit3}+I_2*D_{bit2}+I_1*D_{bit1}+I_0*D_{bit0})*R_f+2V_{min} \quad \text{Equation 12}$$

wherein $D_{bit7}$, $D_{bit6}$, $D_{bit5}$, $D_{bit4}$, $D_{bit3}$, $D_{bit2}$, $D_{bit1}$ and $D_{bit0}$ are bit7, bit6, bit5, bit4, bit3, bit2, bit1 and bit0 of input data, respectively.

The value of $D_{bit}$ for each bit can be 1 or 0. $V_{min}$ corresponds to 00000000 for input data from the data latch unit 122, and $V_{max}$ corresponds to 11111111 for input data from the data latch unit 122. As $V_{max}$ is changed, $V_{min}$ and $V_{ref}$ can be changed to allow the proper operation of an electronic component at the proper emission intensity levels. If the number of bits in the data bus is different, then Equation 12 can be modified to reflect the actual number of bits used.

The embodiment previously described provides a powerful tool for compensating for degradation of a single organic electronic component. In another embodiment, the concepts can be extended to a full-color AM display. Instead of one set of $V_{max}$, $V_{min}$, and $V_{ref}$, three sets of $V_{max}$ $V_{min}$, and $V_{ref}$ can be used for each of the red radiation-emitting electronic components, the green radiation-emitting electronic components, and the blue radiation-emitting electronic components. Therefore, the red radiation-emitting electronic components would have a $V_{max-red}$, $V_{min-red}$, and $V_{ref-red}$, the green radiation-emitting electronic components would have a $V_{max-green}$, $V_{min-green}$, and $V_{ref-green}$, and the blue radiation-emitting electronic components would have a $V_{max-blue}$, $V_{min-blue}$, and $V_{ref-blue}$.

In one embodiment, $L_{max}$ for a pixel may be designed for 200 cd/$m^2$. In a full-color AM display, the pixel can include the red, green, and blue radiation-emitting electronic components. The red radiation-emitting electronic component may be designed to emit 50 cd/$m^2$ ($L_{max-red}$), the green radiation-emitting electronic component may be designed to emit 100 cd/$m^2$ ($L_{max-green}$), and the blue radiation-emitting electronic component may be designed to emit 50 cd/$m^2$ ($L_{max-blue}$). $V_{max-red}$ can be determined by adjusting the emission intensity to 50 cd/$m^2$ when the red radiation-emitting electronic component is on, and not when the green or blue radiation-emitting electronic components are on. The operation is repeated for the green and blue radiation-emitting components. In other embodiments, different values for $L_{max}$, $L_{max-red}$, $L_{max-green}$, and $L_{max-blue}$ can be used, however the determination of $V_{max-red}$, $V_{max-green}$, and $V_{max-blue}$ would be similar. The corresponding values for $V_{min}$ and $V_{ref}$ for each of the red, green and blue radiation-emitting electronic components can be determined using Equations 2 and 3 above.

In one embodiment, the red, green, and blue radiation-emitting electronic components have different materials of organic active layers, wherein the materials degrade at different rates. In one specific embodiment, each of the red, green, and blue radiation-emitting electronic components are recalibrated to achieve 50, 100, and 50 cd/$m^2$, respectively, during a second time period after the original calibration as described above. $V_{max}$ for the red radiation-emitting electronic component can be determined during a first time period ($V_{max-red1}$) and a second time period ($V_{max-red2}$) after the first time. The relative change in $V_{max}$ for the red radiation-emitting electronic component between the first and second time period is given in Equation 13.

$$\Delta V_{max-red}=(V_{max-red2}-V_{max-red1})/V_{n-max-red} \quad \text{Equation 13}$$

wherein:

$\Delta V_{max-red}$ is a relative change between the first and second maximum settings for the red control signal regulator;

$V_{max-red2}$ is the second maximum setting for the red control signal regulator (during the second time period);

$V_{max-red1}$ is the first maximum setting for the red control signal regulator (during the first time period); and $V_{n-max-red}$ is a normalization factor for the red control signal regulator, which can be the first maximum setting for the red control signal regulator, the second maximum setting for the red control signal regulator, or an averaged value using the first and second maximum settings for the red control signal regulator.

The relative changes in $V_{max}$ for the green and blue radiation-emitting electronic components are given in Equation 14 and 15.

$$\Delta V_{max-green}=(V_{max-green2}-V_{max-green1})/V_{n-max-green} \quad \text{Equation 14}$$

wherein:

$\Delta V_{max-green}$ is a relative change between the first and second maximum settings for the green control signal regulator;

$V_{max-green2}$ is the second maximum setting for the green control signal regulator (during the second time period);

$V_{max-green1}$ is the first maximum setting for the green control signal regulator (during the first time period); and $V_{n-max-red}$ is a normalization factor for the green control signal regulator, which can be the first maximum setting for the green control signal regulator, the second maximum setting for the green control signal regulator, or an averaged value using the first and second maximum settings for the green control signal regulator.

$$\Delta V_{max-blue}=(V_{max-blue2}-V_{max-blue1})/V_{n-max-blue} \quad \text{Equation 15}$$

$\Delta V_{max-blue}$ is a relative change between the first and second maximum settings for the blue control signal regulator;

$V_{max-blue2}$ is the second maximum setting for the blue control signal regulator (during the second time period);

$V_{max-blue1}$ is the first maximum setting for the blue control signal regulator (during the first time period); and $V_{n-max-red}$ is a normalization factor for the blue control signal regulator, which can be the first maximum setting for the blue control signal regulator, the second maximum setting for the blue control signal regulator, or an averaged value using the first and second maximum settings for the blue control signal regulator.

Depending on how fast the material(s) degrade, $\Delta V_{max-red}$, $\Delta V_{max-green}$, and $\Delta V_{max-blue}$ may be the same or different from one another. In one embodiment, at least one of $\Delta V_{max-red}$, $\Delta V_{max-green}$, and $\Delta V_{max-blue}$ has a value different from at least one of the other two. In another embodiment $\Delta V_{max-red}$, $\Delta V_{max-green}$, and $\Delta V_{max-blue}$ are different from one another. In still another embodiment $\Delta V_{max-blue}$ may be higher than each of $\Delta V_{max-red}$ and $\Delta V_{max-green}$. In yet another embodiment, $\Delta V_{max-green}$ may be higher than $\Delta V_{max-red}$. Note that in Equations 13–15, $V_{max-red1}$, $V_{max-green1}$, and $V_{max-blue1}$ may be used in the divisor instead of or in conjunction with $V_{max-red2}$, $V_{max-green2}$, and $V_{max-blue2}$, respectively.

From a user's perspective, when operating a display using the D/A converters 324 and the methodology as described herein, the faster degradation of one or more materials within the different radiation-emitting components would not be seen as a loss of color (i.e., tone) or an overall reduction in emission intensity (allowed emission intensity of the red and green radiation-emitting electronic components reduced in order to allow proper color tone control with respect to the faster relative degradation of the blue radiation-emitting electronic component). Calibration and recalibration can be performed at nearly any time. In one embodiment, the calibration may be performed when a finished display is first fabricated. Recalibration can be performed periodically (e.g., once a month, once every 100 hours of use, etc.), as detected to be needed or desirable (emission intensity of one or more radiation-emitting electronic components detected as being too low) by hardware, software, firmware, or any combination thereof or by a user. The recalibration sets the new values for $V_{max}$, $V_{min}$, and $V_{ref}$ for any or all radiation-emitting electronic components to achieve a designed, specified or desired emission intensity of any or all radiation-emitting electronic components within a display.

In another embodiment, pixel-to-pixel variation is addressed. Displays for relatively stationary and video images may have individual radiation-emitting electronic components that decay faster than other radiation-emitting electronic components in an array. For example, in an image of an outdoor scene having a pasture, green radiation-emitting electronic components near the bottom of the display may be used more compared to green radiation-emitting electronic components near the top of the display. Similarly, blue radiation-emitting electronic components near the top of the display may be used more compared to blue radiation-emitting electronic components near the bottom of the display.

Figure 9:
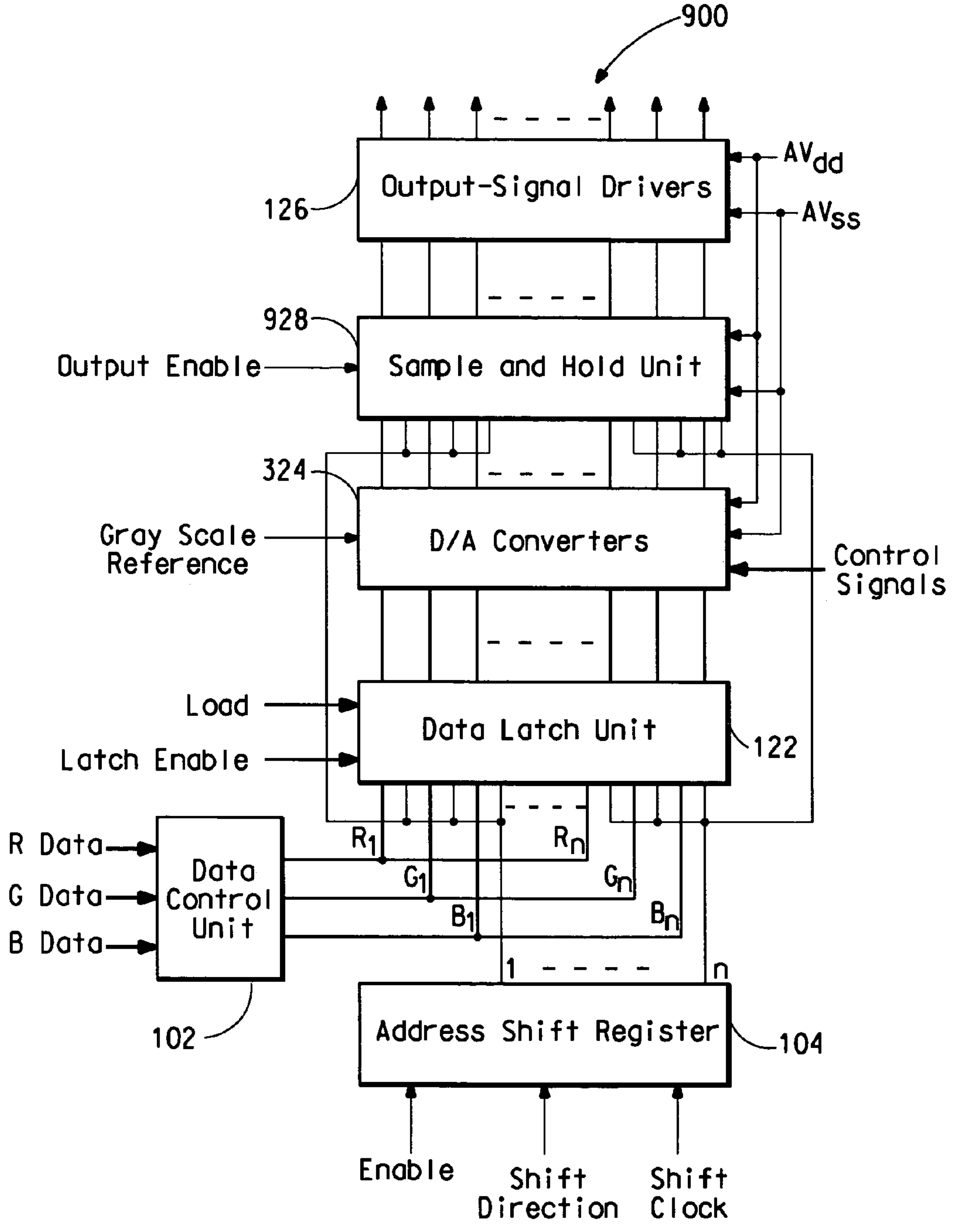
FIG. 9 includes a block diagram of a data driver including a sample-and-hold unit and inputs for control signals and analog power supply signals in accordance with another embodiment.

A different data driver 900 can be used and is illustrated in FIG. 9. Comparing FIGS. 3 and 9, a sample-and-hold unit 928 lies between the D/A converter 324 and the output-signal drivers 126. The sample-and-hold unit 928 includes sample-and-hold circuits (described in more detail later in the specification) that help to keep the emission intensity for the radiation-emitting electronic components more uniform even though the radiation-emitting electronic components may effectively be at different points in their lifetimes. The ability to compensate for pixel-to-pixel variation for the same type of radiation-emitting electronic components between different portions of the displays helps to prolong the useful life (i.e., with proper tone control) for displays used in video and stationary image applications.

A simplified overview of the operation of the data driver 900 is given. Refer to FIG. 3 and its related text for additional information. The address shift register 104 produces scan signals from scan line 1 to scan line n (or scan line n to scan line 1) controlled by the shift direction signal. The data latch unit 122 captures input R, G and B data via the data control unit 102 pixel by pixel. This input is controlled by the scan signal from address shift register 104 and output to the D/A converters 324. The D/A converters 324 change the digital signals into analog signals and output them to the sample-and-hold unit 928 controlled by scan signals from address shift register 104. An output enable signal is received by the sample-and-hold unit 928 which allows data within the sample-and-hold unit 928 to be output to the output-signal drivers 126 as a row of data, which in turn sends the data to the display (not shown in FIG. 9).

In one embodiment, the number of sample-and-hold circuits within the sample-and-hold unit 928 depends on the number of columns or rows (depending on the orientation) and the number of radiation-emitting electronic components within a pixel. In one specific embodiment, the number of sample-and-hold circuits is substantially equal to the number of D/A converters 324.

Figure 10:
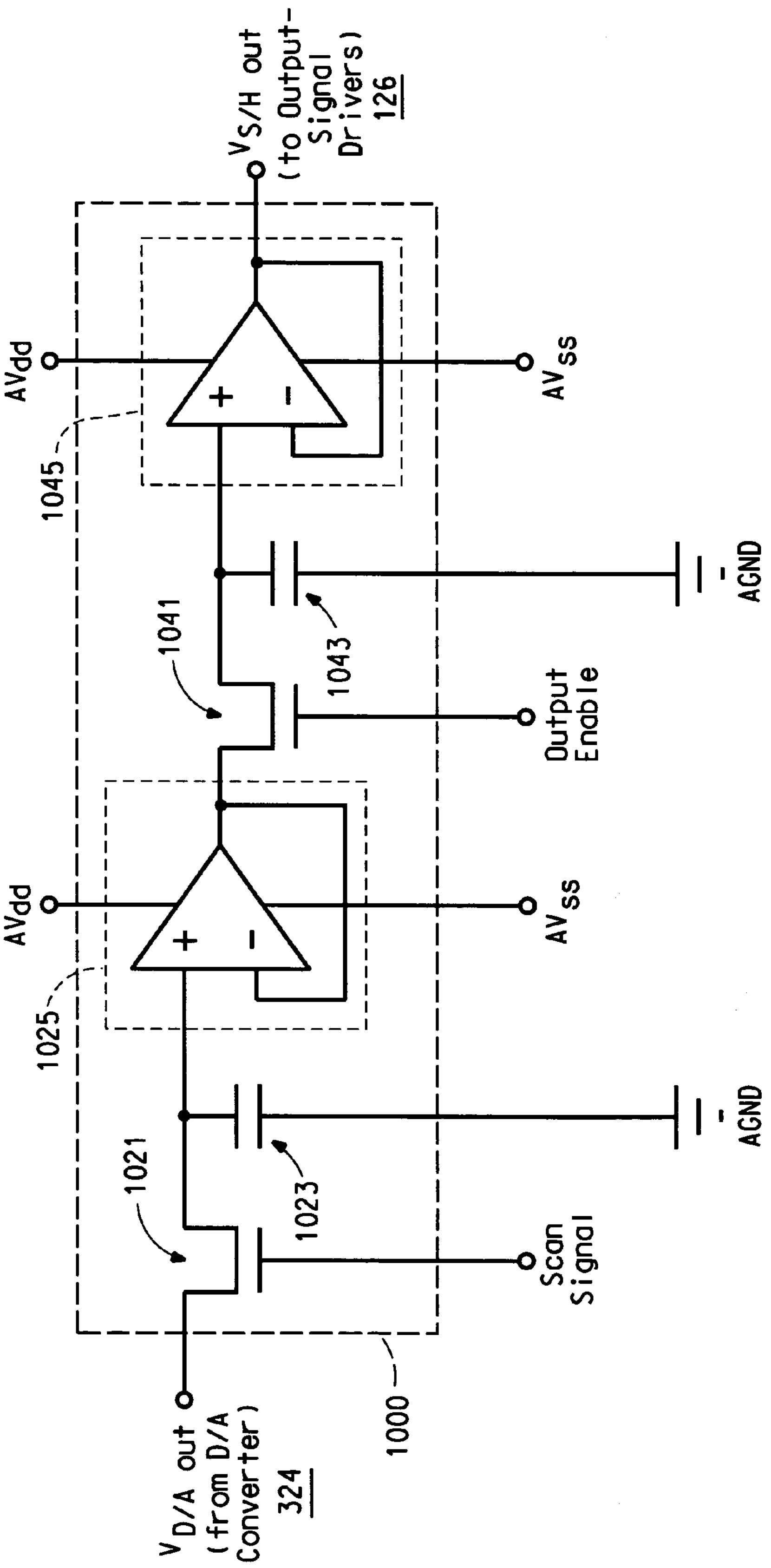
FIG. 10 includes a circuit diagram of one embodiment of a sample-and-hold circuit within the sample-and-hold unit in FIG. 9.

Many different types of sample-and-hold circuits may be used. FIG. 10 includes a circuit diagram of one embodiment of a sample-and-hold circuit 1000. The sample-and-hold circuit 1000 includes a first switch 1021, a first capacitive electronic component 1023, a first buffer 1025, a second switch 1041, a second capacitive electronic component 1043, and a second buffer 1045.

An input of the first switch 1021 is connected to an output of the D/A converter 324, an output of the first switch 1021 is connected to a first electrode of the first capacitive electronic component 1023 and a first (positive) input of the buffer 1025. A control for the first switch 1021 is connected to a scan line. A scan line is a specific type of a select line, whose operation is synchronized with other parts of the display. A second electrode of the first capacitive electronic component 1023 is connected to an AGND line. An output terminal of the first buffer 1025 is connected to an input of the second switch 1041. An output of the second switch 1041 is connected to a first electrode of the second capacitive electronic component 1043 and a first (negative) input of the second buffer 1045. A control for the second switch 1041 is connected to an output enable line. A second electrode of the second capacitive electronic component 1043 is connected to the AGND line. An output terminal of the second buffer 1045 is connected to at least one of the output-signal drivers 126.

The first and second switches 1021 and 1041 may be any of the types described for use with the switch drivers 522 or switches 5241–5244. In one embodiment, the first and second switches 1021 and 1041 are n-channel MISFETs. In one embodiment, the minimum capacitance for the capacitive electronic components 1023 and 1043 is sufficient to drive the differential amplifiers 1025 and 1045, respectively, and is given in Equation 16.

$$C_{min}=0.01667*2/(n*R_{in}) \qquad \text{Equation 16}$$

wherein n is the number of rows, and $R_{in}$ is the input resistance of the differential amplifier 1025 or 1045 to which the capacitive electronic component 1023 or 1043 is connected. For example, if n=240, and $R_{in}$=1 Mohm, then $C_{min}$=0.01667*2/(240*1000000)=139 pF. Theoretically, the capacitance may be unlimited. However, as the capacitance gets higher, the operating speed of the circuit may be reduced. Therefore, in one embodiment, the capacitance may be determined by the operating speed of the display system. In one embodiment, the actual values for the capacitances for each of the capacitive electronic components 1023 and 1043 is in a range of approximately 0.1 to 1000 pF.

Many different types of buffers may be used for the first and second buffers 1025 and 1045. In one embodiment, each of the first and second buffers 1025 and 1045 include differential amplifiers. In another embodiment, the first and second buffers 1025 and 1045 include operational amplifiers. For the first and second buffers 1025 and 1045, the first inputs are positive inputs. Each of the outputs of the first and second buffers 1025 and 1045 is connected to a second (negative) input for those buffers. Each of the first and second buffers 1025 and 1045 includes a third input connected to the $AV_{dd}$ line, and a fourth input connected to the $AV_{ss}$ line. In theory, buffers 1025 and 1045 are not required, however their presence helps to stabilize the operation of the display.

Figure 11:
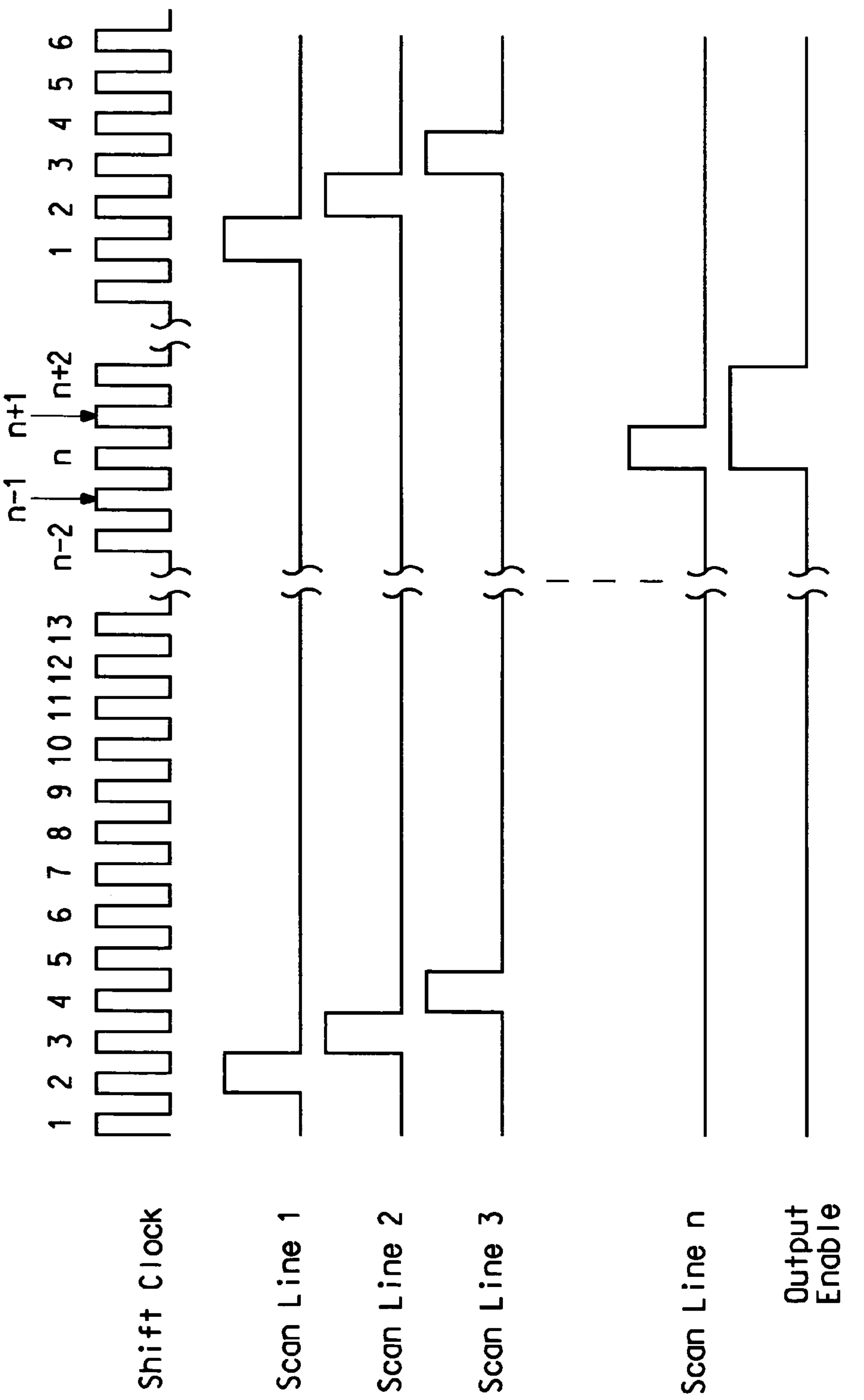
FIG. 11 includes a timing diagram that illustrates the timing of signals for scan lines and an output enable line with respect to a clock signal.

Operation of the sample-and-hold circuit 1000 is described with respect to FIG. 10 and the timing diagram in FIG. 11. Regarding FIG. 11, the horizontal axis of the timing diagram is time, and units of time are represented by the clock signals in FIG. 11. Although the description below is directed to one column of pixels, the other columns of pixels operate substantially identically.

Each of the scan lines is connected to the first switches 1021 within the sample-and-hold circuits 1000. In one embodiment, the number of scan lines corresponds to the number of pixels within a column. Scan line 1 may be connected to each of the pixels along a row. As a signal is sent along scan line 1, first switches 1021, that have controls connected to scan line 1, will turn on. The data signals from the D/A converters 324 charge the first capacitive electronic component 1023. When the first switch 1021 is turned off, charging stops. The other scan lines (scan line 2 to scan line n) operate in a similar manner for the other rows of pixels. The signals for the scan lines come from the address shift register 104 as illustrated in FIG. 9.

Returning to FIGS. 10 and 11, while scan line n is on, or at a time thereafter, a signal is sent along an output enable line to turn on all the second switches 1041. When the second switches are on, current flows through the first buffers 1025, through the second switches 1041 and charges the second capacitive electronic components 1043. Second capacitive electronic components 1043 will hold the signal from the D/A converters 324 and output that signal through buffers 1045 to the output-signal drivers 126. The relative timing for the scan line signals and output enable signals are illustrated in FIG. 11. The process can then be repeated as illustrated near the right-hand portion of FIG. 11.

In another embodiment, the orientation of the output-signal drivers and scan lines can be reversed. Each output-signal driver can be coupled to a row of pixels, and each scan line can be coupled to a column of pixels. Regardless of orientation, the output-signal drivers and scan lines operate in substantially the same manner.

In other embodiments, any or all of the prior equations may be approximations. In one embodiment, a voltage drop through the second transistor (within the control signal regulator 604 or 704) and parasitic resistance (due to contact and wire resistances) within signal lines may need to be considered. Therefore, $V_{th}$ in the Equation 1 may be replaced by $(V_{th}+V_{2ndT})$, $(V_{th}+V_{para})$ or $(V_{th}+V_{2ndT}+V_{para})$, wherein $V_{2ndT}$ is the voltage drop through the second transistor and $V_{para}$ is the voltage drop due to parasitic resistance. Other equations above may be modified in a similar manner. Other approximations may be used to simplify the calculations (e.g., use $V_{th}$ for $V_{min}$). For the purposes of this specification, an approximation is broader than an equation.

The circuit design allows flexibility for different types of electronic components and values for the resistances and capacitances. After reading this specification, skilled artisans will be able to design circuits manually or with the use of automated design tools (e.g., a circuit simulator). After determining the number of rows and columns of the display, and the operating speed of the circuits (e.g., KHz, MHz, or GHz), optimal values of resistances, capacitances, and specific types of the electronic components can be obtained.

While some of the description above addresses organic electronic components, the concepts described herein can be used for other types of radiation-emitting electronic components where emission intensity changes over time. Other radiation-emitting electronic components can include light bulbs, inorganic LEDs, including III-V or II-VI-based inorganic radiation-emitting components. In one embodiment, the radiation-emitting electronic components may emit radiation within the visible light spectrum, and in another embodiment, the radiation-emitting electronic component may emit radiation outside the visible light spectrum (e.g., UV or IR). Note that the change could include an increase in emission intensity as opposed to a decrease.

In another embodiment, the concepts described herein may be extended to other types of electronic devices. In one embodiment, a sensor array may include an array of radiation-responsive electronic components. In one embodiment, different radiation-responsive electronic components may have the same or different active materials. The response of those active materials may change over time. Further some of the sensor array may have different portions that receive different wavelengths, different radiation intensities, or a combination thereof. A compensation scheme can be used to adjust the change (increase or decrease) in sensitivity due to age or exposure to radiation. Similar to an electronic device with radiation-emitting electronic components, the lifetime of an electronic device with radiation-responsive electronic components may have a longer useful life.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A D/A converter comprising:

a D/A module for converting a digital signal to a first analog signal, wherein a first D/A module input is configured to receive the digital signal, a second D/A module input is configured to receive $V_{ref}$, and a first D/A module output is configured to output the first analog signal;

a first differential amplifier for amplifying the first analog signal to a second analog signal, wherein the first differential amplifier comprises:

a first input of the first differential amplifier coupled to the first D/A module output;

a second input of the first differential amplifier coupled to a first control signal, wherein the first control signal is $V_{min}$; and an output of the first differential amplifier configured to output the second analog signal;

a first resistive electronic component having a first terminal and a second terminal, wherein the first terminal of the first resistive electronic component is connected to the D/A module, and the second terminal of the first resistive electronic component is connected to the first input of the first differential amplifier; and a second resistive electronic component having a first terminal and a second terminal, wherein the first terminal of the second resistive electronic component is connected to the first input of the first differential amplifier, and the second terminal of the second resistive electronic component is connected to the output of the first differential amplifier, wherein the first resistive electronic component and the second resistive electronic component have substantially a same resistance.

2. A D/A converter comprising:

a D/A module for converting a digital signal to a first analog signal, wherein a first D/A module input is configured to receive the digital signal, a second D/A module input is configured to receive $V_{ref}$, and a first D/A module output is configured to output the first analog signal; and a first differential amplifier for amplifying the first analog signal to a second analog signal, wherein the first differential amplifier comprises:

a first input of the first differential amplifier coupled to the first D/A module output;

a second input of the first differential amplifier coupled to a first control signal, wherein the first control signal is $V_{min}$; and a output of the first differential amplifier configured to output the second analog signal;

wherein the D/A module further comprises:

a voltage divider network comprising:

a third D/A module input for receiving a second control signal;

switches configured to receive the digital signal from the first D/A module input; and resistive electronic components coupled to the second input; and a second differential amplifier comprising:

a first input of the second differential amplifier coupled to an output of the voltage divider network;

a second input of the second differential amplifier connected to an AGND line; and an output of the second differential amplifier coupled to the first input of the first differential amplifier.

3. The D/A converter of claim 2, wherein the resistive electronic components of the voltage divider comprise first resistive electronic components and second resistive electronic components, wherein:

each of the first resistive electronic components has substantially a first resistance; and each of the second resistive electronic components has substantially a second resistance that is substantially twice the first resistance.

4. The D/A converter of claim 2, wherein each of the first and second differential amplifiers further comprises:

a third input configured to receive $AV_{dd}$; and a fourth input configured to receive $AV_{ss}$.

5. An electronic device comprising:

D/A converters;

sample-and-hold circuits coupled the D/A converters, wherein each of the sample-and-hold circuits comprises:

a first switch including an input, an output, and a control, wherein the input of the first switch is connected to one of the D/A converters and the control of the first switch is coupled to a scan line;

a first capacitive electronic component including a first electrode and a second electrode, wherein the first terminal of the first capacitive electronic component is connected to an AGND line, and the second electrode of the first capacitive electronic component is connected to the output of the first switch;

a first buffer including a first input and an output, wherein the first input of the first buffer is connected to the output of the first switch and the second electrode of the first capacitive electronic component;

a second switch including an input, an output, and a control, wherein the input of the second switch is connected to the output of the first buffer and the control of the second switch is coupled to an output enable line;

a second capacitive electronic component including a first electrode and a second electrode, wherein the first electrode of the second capacitive electronic component is connected to the AGND line, and the second electrode of the second capacitive electronic component is connected to the output of the second switch; and a second buffer including a first input and an output, wherein the first input of the second buffer is connected to the output of the second switch and the second electrode of the second capacitive electronic component, and the output of the second buffer is connected to one of the output-signal drivers;

at least one organic electronic component coupled to the sample-and-hold circuits, wherein the at least one organic electronic component comprise at least one organic active layer; and output-signal drivers coupled to and, from a circuit diagram perspective, lying between the sample-and-hold circuits and the at least one organic electronic component.

6. The electronic device of claim 5, wherein:

the first buffer comprises a first differential amplifier and the second buffer comprises a second differential amplifier;

first power inputs for the first and second differential amplifiers are configured to receive A $V_{dd}$;

second power inputs for the first and second differential amplifiers are configured to receive A $V_{ss}$;

positive inputs for the first and second differential amplifiers are the first inputs of the first and second buffers, respectively; and negative inputs for the first and second differential amplifiers are connected to the outputs of the first and second buffers, respectively.

7. The electronic device of claim 5, wherein inputs for the D/A converters include $AV_{dd}$, $AV_{ss}$, AGND, $V_{ref}$ and $V_{min}$.

8. The electronic device of claim 7, further comprising an array of pixels organized into rows and columns, wherein each row or each column comprises:

at least one of the D/A converters;

at least one of the sample-and-hold circuits; and at least one of the output-signal drivers.

9. The electronic device of claim 8, wherein each pixel comprises at least three organic electronic components, wherein along a row or column, each row or each column comprises:

at least three of the D/A converters;

at least three of the sample-and-hold circuits; and at least three of the output-signal drivers.

10. A method of operating an electronic device comprising a first electronic component and a first control signal regulator coupled to the first electronic component, wherein the method comprises:

determining a first maximum setting for the first control signal regulator in order to achieve a first radiation intensity from the first electronic component during a first time period; and determining a second maximum setting for the first control signal regulator in order to achieve the first radiation intensity from the first electronic component during a second time period.

11. The method of claim 10, further comprising using the first electronic component at a third time between the first and second times.

12. The method of claim 10, further comprising determining a first minimum setting of the first control signal regulator, wherein the first minimum setting is proportional to the first maximum setting divided by a number of designed levels of the first radiation intensity.

13. The method of claim 12, further comprising determining a second minimum setting of the first control signal regulator, wherein the second minimum setting is proportional to the second maximum setting divided by a number of designed levels of the first radiation intensity.

14. The method of claim 12, wherein the first control signal regulator comprises a transistor that controls a current flowing to or from the first electronic component.

15. The method of claim 14, wherein each of the first minimum setting and the second minimum setting is equal to a threshold voltage of the transistor.

16. The method of claim 14, wherein:

the electronic device comprises a data driver circuit designed to operate using at least n bits of data; and $$V_{min1} \approx (V_{max1} - V_{th})/2^{n/2} + V_{th}$$

wherein:

$V_{min1}$ is the first minimum setting;

$V_{th}$ is a threshold voltage for the transistor;

$V_{max1}$ is the first maximum setting; and n is the number of bits within a digital input signal.

17. The method of claim 16, wherein the electronic device comprises a D/A converter comprising:

a voltage divider network comprising first resistive electronic components and second resistive electronic components, wherein:

each of the first resistive electronic components has substantially a first resistance; and each of the second resistive electronic components has substantially a second resistance that is substantially twice the first resistance;

a differential amplifier coupled to an output of the voltage divider network; and a third resistive electronic component having a first terminal connected to an output of the differential amplifier, and a second terminal connected to an input of the differential amplifier.

18. The method of claim 17, wherein:

$$V_{ref} \approx (V_{max1} - 2V_{th})*2^n*R/(R_f*(2^n-1)) + \text{AGND},$$

wherein:

$V_{ref}$ is a control voltage;

R is the first resistance;

$R_f$ is a resistance of the third resistive electronic component; and

AGND is a voltage of analog ground.

19. A method of claim 10, wherein:

the electronic device further comprises:

a second electronic component and a second control signal regulator coupled to the second electronic component; and a third electronic component and a third control signal regulator coupled to the third electronic component; and the method further comprises:

determining a first maximum setting for the second control signal regulator in order to achieve a second radiation intensity from the second electronic component during the first time period;

determining a first maximum setting for the third control signal regulator in order to achieve a third radiation intensity from the third electronic component during the first time period;

determining a second maximum setting for the second control signal regulator in order to achieve the second radiation intensity from the second electronic component during the second time period; and determining a second maximum setting for the third control signal regulator in order to achieve the third radiation intensity from the third electronic component during the second time period.

20. The method of claim 19, wherein:

$$\Delta V_{max1} = (V_{max12} - V_{max11})/V_{n\text{-}max1};$$

$$\Delta V_{max2} = (V_{max22} - V_{max21})/V_{n\text{-}max2};$$

$$\Delta V_{max3} = (V_{max32} - V_{max31})/V_{n\text{-}max3};$$

$\Delta V_{max1}$ is a relative change between the first and second maximum settings for the first control signal regulator;

$V_{max12}$ is the second maximum setting for the first control signal regulator;

$V_{max11}$ is the first maximum setting for the first control signal regulator;

$V_{n\text{-}max1}$ is the fast maximum setting for the first control signal regulator, the second maximum setting for the first control signal regulator, or a first averaged value using the first and second maximum settings for the first control signal regulator;

$\Delta V_{max2}$ is a relative change between the first and second maximum settings for the second control signal regulator, $V_{max22}$ is the second maximum setting for the second control signal regulator;

$V_{max21}$ is the first maximum setting for the second control signal regulator;

$V_{n\text{-}max2}$ is the first maximum setting for the second control signal regulator, the second maximum setting for the second control signal regulator, or a second averaged value using the first and second maximum settings for the second control signal regulator;

$\Delta V_{max3}$ is a relative change between the first and second maximum settings for the third control signal regulator;

$V_{max32}$ is the second maximum setting for the third control signal regulator;

$V_{max31}$ is the first maximum setting for the third control signal regulator;

$V_{n\text{-}max3}$ is the first maximum setting for the third control signal regulator, the second maximum setting for the third control signal regulator, or a third averaged value using the first and second maximum settings for the third control signal regulator; and at least one of $\Delta V_{max1}$, $\Delta V_{max2}$, or $\Delta V_{max3}$ has a value different from at least one of the other two.

21. The method of claim 10, wherein the first electronic component comprises an organic active layer.

* * * * *